(12) United States Patent
Parker

(10) Patent No.: US 12,197,821 B2
(45) Date of Patent: Jan. 14, 2025

(54) COORDINATING CONVERSION BETWEEN FLOORPLAN USER INTERFACE LAYERS

(71) Applicant: Nuvolo Technologies Corporation, Paramus, NJ (US)

(72) Inventor: Collin Parker, Chatsworth, CA (US)

(73) Assignee: Nuvolo Technologies Corporation, Paramus, NJ (US)

( * ) Notice: Subject to any disclaimer, the term of this patent is extended or adjusted under 35 U.S.C. 154(b) by 1039 days.

(21) Appl. No.: 17/117,527

(22) Filed: Dec. 10, 2020

(65) Prior Publication Data

US 2022/0188472 A1 Jun. 16, 2022

(51) Int. Cl.
*G06F 30/13* (2020.01)
*G06F 16/29* (2019.01)
*G06T 3/40* (2024.01)

(52) U.S. Cl.
CPC .............. *G06F 30/13* (2020.01); *G06F 16/29* (2019.01); *G06T 3/40* (2013.01)

(58) Field of Classification Search
CPC .......... G06F 30/13; G06F 30/20; G06F 30/25; G06F 30/27; G06F 30/28; G06F 16/29; G06T 3/40; G06T 2219/2004; G06T 15/10; G06T 17/05; G06T 2200/24; G01C 21/383
See application file for complete search history.

(56) References Cited

U.S. PATENT DOCUMENTS

| | | | |
|---|---|---|---|
| 6,341,291 B1 | 1/2002 | Bentley et al. | |
| 8,155,943 B2 | 4/2012 | Nasle | |
| 8,818,769 B2 | 8/2014 | Trainer et al. | |
| 9,454,623 B1 | 9/2016 | Kaptsan | |
| 10,121,286 B2 | 11/2018 | Alsaffar et al. | |
| 10,445,438 B1 | 10/2019 | Motonaga et al. | |
| 2007/0186160 A1 | 8/2007 | McArdle et al. | |
| 2008/0172605 A1 | 7/2008 | Smith | |
| 2010/0169272 A1 | 7/2010 | Labatte et al. | |
| 2015/0106325 A1 | 4/2015 | Cole et al. | |
| 2016/0246899 A1 | 8/2016 | Hirschtick et al. | |
| 2016/0328421 A1 | 11/2016 | Sarratori et al. | |

(Continued)

OTHER PUBLICATIONS

Fang, Yiping, Vivek Shandas, and Eugenio Arriaga Cordero. "Spatial thinking in planning practice: An introduction to GIS." (2014). (Year: 2014).*

(Continued)

*Primary Examiner* — Michael Edward Cocchi
(74) *Attorney, Agent, or Firm* — Mintz Levin Cohn Ferris Glovsky and Popeo, P.C.; Frank L. Gerratana

(57) ABSTRACT

Systems and techniques for rendering multi-layer computer-aided design related documents are described. A described technique includes maintaining, for concurrent presentation on a device, a first map layer with a first geographic coordinate system and a second map layer with a second different coordinate system; determining a projection from the first geographic coordinate system to the second different coordinate; generating, using the projection from the first geographic coordinate system to the second different coordinate system, instructions for presentation of a user interface that depicts the first map layer concurrently with the second map layer; and providing, to the device, the instructions to cause the device to present the user interface.

21 Claims, 10 Drawing Sheets

(56) References Cited

U.S. PATENT DOCUMENTS

| | | |
|---|---|---|
| 2017/0147717 A1 | 5/2017 | Chen et al. |
| 2018/0113878 A1 | 4/2018 | Duggal et al. |
| 2019/0213287 A1 | 7/2019 | Ye et al. |
| 2020/0285514 A1 | 9/2020 | Ghare et al. |
| 2020/0351337 A1 | 11/2020 | Calmon et al. |
| 2021/0073449 A1 | 3/2021 | Segev et al. |
| 2021/0383037 A1 | 12/2021 | Segev et al. |
| 2022/0092225 A1 | 3/2022 | Parker et al. |
| 2022/0092834 A1 | 3/2022 | Ye et al. |
| 2022/0171892 A1 | 6/2022 | Ho et al. |
| 2022/0171893 A1 | 6/2022 | Ye et al. |
| 2022/0206445 A1 | 6/2022 | Reichl et al. |
| 2022/0206856 A1 | 6/2022 | Parker |
| 2022/0214999 A1 | 7/2022 | Yadav et al. |
| 2022/0215604 A1 | 7/2022 | Ho et al. |

OTHER PUBLICATIONS

Zhou, Xiaodong, et al. "A PDF Tile Model for Geographic Map Data." ISPRS international journal of geo-information 8.9 (2019): 373. (Year: 2019).*

Xu, Zhao, et al. "Combining IFC and 3D tiles to create 3D visualization for building information modeling." Automation in Construction 109 (2019): 102995. (Year: 2019).*

Trujillo, Agustín, et al. "Glob3 mobile: An open source framework for designing virtual globes on ios and android mobile devices." Progress and New Trends in 3D Geoinformation Sciences (2013): 211-229. (Year: 2013).*

Ekanayake et al. (2008) "MapReduce for Data Intensive Scientific Analysis", Fourth IEEE International Conference on eScience, 277-284 Pages.

Github.com, [online] "Deepzoom (php library)", Daniel-KM Library Deepzoom, retrieved on Aug. 17, 2020, retrieved from URL: https://github.com/Daniel-KW/LibraryDeepzoom, 4 pages.

Github.com, [online] "TiledSharp", Marshallward/TiledSharp, retrieved on Aug. 17, 2020, retrieved from URL: https://github.com/marshallward/TiledSharp, 4 pages.

Stackexchange.com, [online] "If Geographic Coordinates are unprojected coordinates, how can GIS soft wares display such unprojected data in a plane?", Geographic Information Systems, retrieved on Jun. 2, 2020, retrieved from URL: https://gis.stackexchange.com/questions/146321/if-geographic-coordinates-are-unprojected-coordinates-how-can-gis-softwares-dis#:-:text, 2 pages.

Wikipedia, "Map projection", retrieved from URL: https://en.wikipedia.org/w/index.php?title=Map_projection&oldid=955953903, 2020, 16 pages.

Wikipedia, "Spatial reference system", retrieved from URL: https://en.wikipedia.org/w/index.php?title=Spatial_reference_system&oldid=956142752, 2020, 4 pages.

Wikipedia, "Tiled web map", retrieved from URL: https://en.wikipedia.org/w/index.php?title=Tiled_web_map&oldid=956139437, 2020, 3 pages.

Chen et al. (2019) "Floor-SP: Inverse CAD for Floorplans by Sequential Room-Wise Shortest Path", IEEE International Conference on Computer Vision (ICCV), 10 pages.

Muller et al. (2006) "Procedural Modeling of Buildings", Association for Computing Machinery, Inc., 25(3):614-623.

Zhu et al. (Dec. 19, 2013) "A New Reconstruction Method for 3D Buildings From 2D Vector Floor Plan", HAL Open Science, pp. 1-14(15 pages).

Condie, et al. (2010) "Online Aggregation and Continuous Query Support in Mapreduce SIGMOD'10", pp. 1115-1118.

* cited by examiner

COORDINATING CONVERSION BETWEEN FLOORPLAN USER INTERFACE LAYERS

BACKGROUND

This description relates to computing processes for auditing and resolving issues in computer-aided design documents.

Computer aided design (CAD) software has been developed and used to generate two-dimensional (2D) or three-dimensional (3D) representations of various things including objects and buildings. After designing, a CAD program can output a CAD document that is based on a file format, such as Drawing Exchange Format (DXF), DWG (AutoCAD drawing database file), and DGN (a file format created by the Open Design Alliance and Bentley Systems). Other file types are possible. A CAD document can provide data representations of one or more real-world constructs. These data representations can be, for example, 2D floorplans for a building, where the floorplans include different outlines for each room of a floor. Data representations of real-world constructs in separate CAD files can be encoded and arranged differently based on preferences and design choices used in a CAD program.

SUMMARY

Systems and techniques for rendering multi-layer computer-aided design related documents are described. A described technique includes maintaining, for concurrent presentation on a device, a first map layer with a first geographic coordinate system and a second map layer with a second different coordinate system; determining a projection from the first geographic coordinate system to the second different coordinate; generating, using the projection from the first geographic coordinate system to the second different coordinate system, instructions for presentation of a user interface that depicts the first map layer concurrently with the second map layer; and providing, to the device, the instructions to cause the device to present the user interface. Other implementations include corresponding systems, apparatus, and computer programs to perform the actions of methods defined by instructions encoded on computer readable storage.

These and other implementations can include one or more of the following features. Implementations include receiving, from the device, input data that indicates user interaction with the user interface and identifies a first point in the first geographic coordinate system; converting, using the input data and the determined projection, the first point to a second point in the second different coordinate system; and determining an action to perform for the second map layer using the second point in the second different coordinate system. Determining the action to perform for the second map layer can include determining that the input data indicates a request for a zoom operation at the first point. Based on detection of a zoom operation, implementations can perform operations including determining an updated zoom level using the zoom operation and a zoom level for the second map layer presented in the user interface; retrieving, from memory, content for the second map layer using the second point and the updated zoom level; and providing, to the device, the content for the second map layer to cause the device to present the content in the user interface. Retrieving the content can include retrieving an image tile for the second map layer that depicts data for the second point at the updated zoom level. Providing the content can include providing, to the device, the image tile for the second map layer to cause the device to present the image tile in the user interface. Retrieving the image tile can include retrieving an image tile that has a first coordinate that represents the updated zoom level and one or more second coordinates that encompass the second point.

Using, as the new origin location, the location on the coordinate reference system onto which the feature for the first geographic coordinate system is unprojected can include using, as the new origin location, the location on the coordinate reference system onto which a top, left corner of the first map layer for the first geographic coordinate system is unprojected. In some implementations, the first map layer includes an interactive GeoJSON layer, where GeoJSON is a geospatial data interchange format based on JavaScript Object Notation (JSON). The first geographic coordinate system can include latitude and longitude coordinates. In some implementations, the second map layer includes an image layer that depicts content of a floorplan. The image layer can include one or more image tiles. The second different coordinate system can include a Cartesian coordinate system. In some implementations, the image layer can be represented using a graphics format such as scalable vector graphics (SVG).

Creating the coordinate reference system that has the origin at the initial origin location can include creating the coordinate reference system that has the origin at the initial origin location with a first coordinate for a first axis and a second coordinate for a second axis. Updating the coordinate reference system to have the origin at the new origin location can include updating the coordinate reference system to have the origin at the new origin location with a third coordinate for the first axis and a fourth coordinate for the second axis, the third coordinate being a different coordinate than the first coordinate and the fourth coordinate being a different coordinate than the second coordinate.

Determining the projection from the first geographic coordinate system to the second different coordinate system can include determining a first projection for a first floorplan from the first geographic coordinate system to the second different coordinate system. Implementations can include determining a second projection for a second floorplan from a third geographic coordinate system for a third may layer to a fourth different coordinate system for a fourth map layer. The first and second floorplans can be different.

Particular embodiments of the subject matter described in this specification can be implemented to realize one or more of the following advantages. One of more of the described techniques and systems can enable efficient rendering of multiple layers that are associated with a floorplan and include different layers with different coordinate systems. Use of a determined projection can enable a floorplan rendering system to more accurately present multiple layers concurrently. Use of the determined projection can enable the floorplan rendering system to more accurately detect user interaction with a particular portion of the floorplan. Increased accuracy can improve user experience by reducing or eliminating discrepancies between the intended user action and the actual action carried out by a processor caused by a misalignment.

When the layers are not correctly aligned in their presentation for example, the floorplan rendering system may detect user interaction with a particular part of the interactive layer that aligns with an incorrect part of the actual floorplan image, e.g., part of the floorplan image to the side of where the user interaction, such as a mouse click, actually occurred. Using the projection, the floorplan rendering system is able determine which part of the interactive layer is presented in the same portion of a user interface, e.g., on a screen, as a corresponding part of an image of a floorplan. This can enable the floorplan rendering system to take an appropriate action based on user interaction with the floorplan when the floorplan rendering system can perform different actions based on interaction with different parts of the floorplan. In some examples, using different projections for presentation of different types of layers, e.g., images, can enable the floorplan rendering system to select a correct projection type based on a particular combination of layers.

The details of one or more implementations are set forth in the accompanying drawings and the description below. Other features and advantages will be apparent from the description and drawings, and from the claims.

BRIEF DESCRIPTION OF THE DRAWINGS

Like reference numbers and designations in the various drawings indicate like elements.

DETAILED DESCRIPTION

A system can render, via a user interface, multiple layers associated with one or more CAD documents that describe a floorplan. These layers can have different coordinate systems. One layer can include visual content, such as an image of a floorplan or another type of map. Another layer can include interactive content, such as an interactive layer that detects user interaction with the floorplan. When different layers have different coordinate systems, the floorplan rendering system can convert coordinates from one coordinate system to another to correctly present the content. The type of conversion can depend on the type of layers, e.g., whether the image of a floorplan is a SVG image or an image tile that depicts a portion of the content that would be depicted by the SVG image.

When the floorplan rendering system presents one or more image tiles with an interactive layer, the floorplan rendering system can determine the conversion by creating a coordinate reference system with an origin identified by a feature for the SVG image. The feature can be the top-left corner, the bottom-left corner, the bottom-right corner, the top-right corner, or another appropriate feature. The floorplan rendering system can identify the origin by unprojecting coordinates for the SVG image onto the coordinate reference system.

Using the coordinate reference system with the identified origin, the floorplan rendering system can project another coordinate system for the interactive layer onto the coordinate reference system. The floorplan rendering system can then use the specific relationship between the coordinate reference system and coordinates for each of the two layers to determine a projection between the two layers. The floorplan rendering system can use this projection to present the two layers concurrently.

Figure 1:
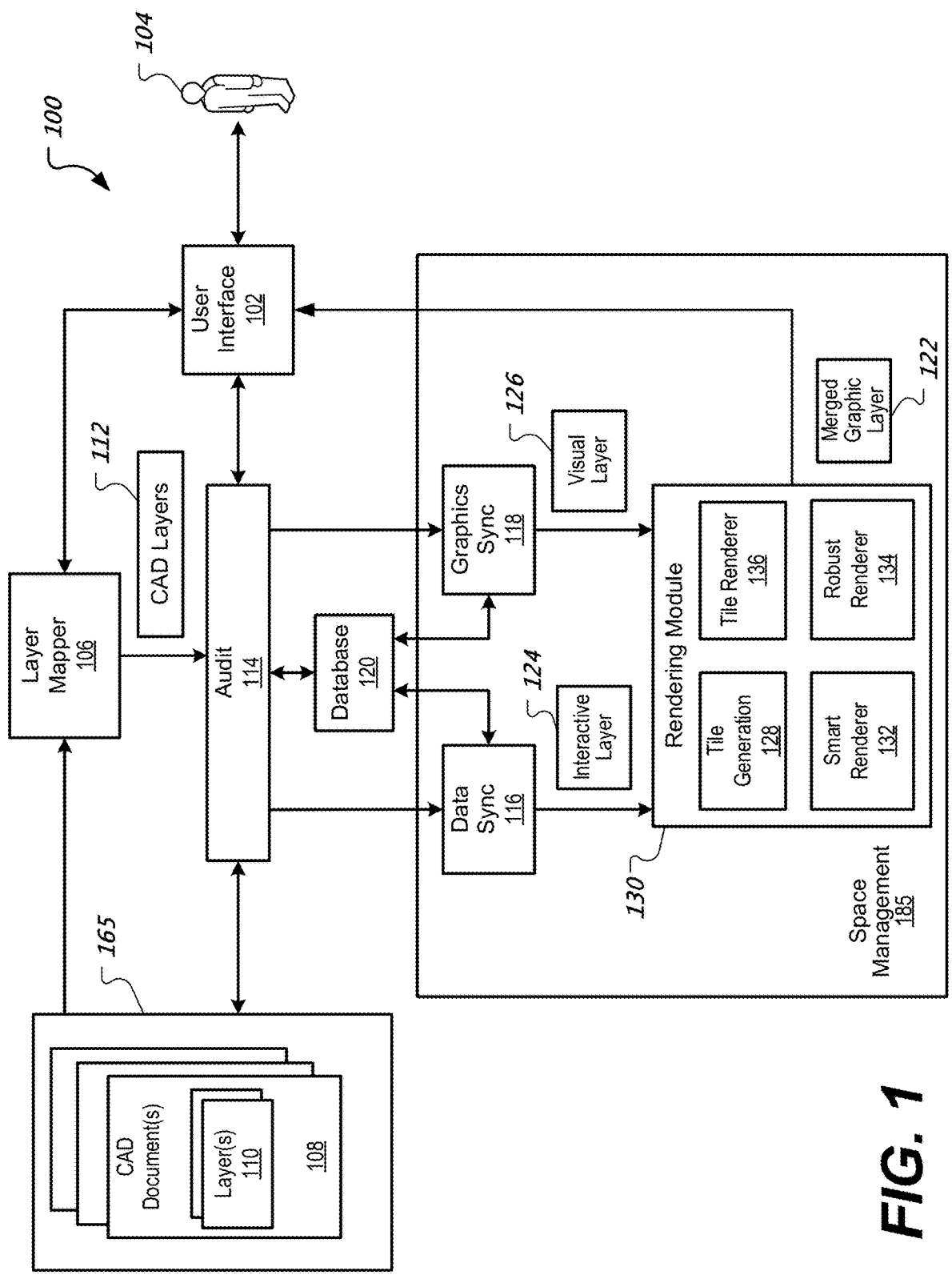
FIG. 1 shows an example of a computing system configured to process one or more CAD documents.

FIG. 1 shows an example of a computing system 100 configured to process one or more CAD documents 108. The system 100 includes a user interface 102 that interacts with a user 104, e.g., receives input from a user 104, or provides output to the user 104. The user interface 102 can graphically render output, such as information based on the CAD documents 108, to the user 104. The system 100 can include one or more computing devices, including a device operable to display a user interface 102 such as a graphical user interface (GUI), e.g., a desktop computer with a display monitor, a laptop computer, a tablet device, a smartphone, a networked client/mobile device, or other related devices. A computing device can be operable to exchange data communications with other devices (e.g., client and server devices) of the system 100.

A CAD document 108 can include one or more layers 110. In some implementations, the layers can be stored in different files. A layer 110 of a respective CAD document 108 can correspond to an item of a geographic entity, such as a building or physical location. For example, each of the layers 110 can correspond to a respective item such as a floorplan of a floor in the building, a room of a floor in the building that is represented by the floorplan, or an interior or exterior wall of a room included in the floorplan. Additional details about individual layers and corresponding items that can be associated with a given layer are described in more detail below. In some implementations, a CAD document 108 can include information about the regions represented by a floorplan, e.g., a region's space code, space name, and space type.

In some implementations, the system 100 is configured to implement a framework for interpreting and extracting graphics and data elements of a CAD document 108 to digitally render the items of a building for presentation to the user 104. The graphics and data elements cooperate to present a digital representation of the items in an application program used to generate the CAD document 108. In some implementations, the CAD document 108 can be a file generated by a CAD program. The CAD document 108 can be based on a file format such as DXF, DWG, and can encode data representations of real-world items, such as the example items described above.

Data representations of real-world items in separate or distinct CAD documents 108, or even across distinct layers of a CAD document, can be encoded and arranged differently based on design preferences and drafting protocols used in the CAD program. Because these data representations are often encoded in a variety of ways, extracting specific types of information from a CAD document can be challenging. To address these challenges, the system 100 can include a set of modules which can be configured to execute a subset of the techniques for implementation of the framework used to extract graphics and data elements of a CAD document or present at least some of the extracted graphics, data elements, or both. These modules can be implemented as computer programs that are executable by one or more processors.

The system 100 includes a module called a layer mapper 106 which can receive one or more CAD documents 108. Each CAD document 108 can include one or more layers 110. In some implementations, the layer mapper 106 obtains the CAD documents 108 based on an input from user 104 which is received by way of user interface 102. In some implementations, the layer mapper 106 can receive or obtain the CAD documents 108 independent of input from user 104 but execute its file audit and data processing operations based on user input received by way of user interface 102.

In some implementations, the layer mapper 106 automatically imports the CAD documents 108 from a file storage 165 and automatically executes its layer mapping and data processing operations. The file storage 165 can include a computer-readable medium. The file storage 165 can be internal or external to the system 100. In some implementations, the file storage 165 includes a database 120. The database 120 can include one or more database tables for storing information about space hierarchies of a geographic location. The space hierarchies may define a physical layout of an area, office, campus, site, or floor of the geographic location. In some implementations, the CAD documents 108 are stored within the database 120. In some implementations, the database 120 resides in a memory.

The layer mapper 106 can be configured to obtain one or more of the CAD documents 108 and generate a layer mapping file based on processes performed on the received CAD documents 108. In some implementations, the processes can be executed by the layer mapper 106 based on a mapping template, user input from user 104, or both. In some implementations, the layer mapper 106 generates a layer mapping file based on instructions or commands specified by a space/system administrator ("space admin") that indicate operations to be performed on the CAD documents 108. In some cases, the space admin can be the same as user 104 or a different user of the system 100. The instructions can define or indicate layers of the CAD documents 108 as well as computer-aided facility management (CAFM) layers stored among database tables of the database 120.

The layer mapper 106 can select a mapping template that defines protocols for aggregating sets of data values of the different layers with respect to instructions and database values of CAFM layers as indicated by a space admin. For example, the layer mapper 106 can receive layer data for multiple layers of a CAD document 108, where the layer data specifies information for items such as hallways, offices on a floor, conference rooms, restrooms, types of furniture in the offices, locations of security cameras on the floor, or capabilities of various equipment such as network devices such as routers or Wi-Fi hotspots, printers, or copiers on the floor. The layer mapper 106 can use the template protocols to aggregate values for types of office furniture for a particular office while, for example, filtering out data values that indicate locations of security cameras on a floor.

More specifically, for one or more CAD documents 108, the layer mapper 106 can map portions of the layer data for different layers, such as furniture in the offices, to a hierarchy of CAFM layers (e.g., indicating each office on a floor), which can be defined in the database 120, to produce a grouping of CAD layers 112. For example, the grouping of CAD layers 112 can represent a group of offices on the 9th floor of a building along with each item of furniture in each office of the group. In some implementations, the layer mapper 106 determines the mapping between the drawing layers and the CAFM layers at least by processing data values of the different drawing layers (e.g., received inputs) against the protocols defined by the mapping template and with reference to any grouping preferences indicated by the user 104 or the space admin.

The layer mapper 106, in some implementations, generates a layer mapping output represented by CAD layers 112 based on the mapping between layers of the CAD documents 108 and CAFM layers in a database table of the database 120. In some implementations, the layer mapper 106 generates a layer mapping output that aggregates information such as data values and entity records of the received inputs based on the determined mapping of the layers. The layer mapper 106 can generate a layer mapping output that groups layer types such as the offices, the Wi-Fi hotspots, and the types of office furniture for visual rendering to an end-user, e.g., user 104 or a different user.

An audit module 114 can receive CAD documents 108 including their layers 112 from the layer mapper 106. The audit module 114 can detect and resolve issues that would otherwise inhibit importation of data from the CAD document 108 to a space management module 185. The audit module 114, for example, can apply one or more rule sets to a CAD document 108 to detect issues within the CAD document before importing the contents of the document into the space management module 185. In this example, the space management module 185 includes a data sync module 116, graphics sync module 118, and rendering module 130. Other, fewer, or more modules are possible.

In some implementations, the audit module 114 can process a CAD document 108 directly in file storage 165. In some implementations, the audit module 114 can process a version of the CAD document 108 stored in a computer memory such as a random access memory. In some implementations, the audit module 114 generates an audit output based on processes performed on the received inputs. In some implementations, the audit output includes a modified CAD document. In some implementations, the audit output includes a data structure.

The audit module 114, in some implementations, can be configured to process data corresponding to each of the CAD layers 112 to identify one or more deficiencies and generate an audit output file based on the identified deficiencies. The audit module 114 can scan each of the CAD layers 112 to detect individual deficiencies that may adversely impact a CAD document importation process executed by the system 100. In some implementations, the audit module 114 can read entity records that store data values for a layer to detect deficiencies such as unclosed polylines, missing space codes, missing space names, missing space types, or invalid space types. In some implementations, the audit module 114 detects deficiencies of a CAD document in response to processing data types of a layer or entity record of the CAD document against a predefined list of deficiency codes.

The audit module 114 can be configured to automatically resolve the detected deficiencies. In some implementations, audit module 114 can be configured to generate a notification about the detected deficiencies for rendering via the user interface 102. The notification can include one or more recommendations for addressing a detected deficiency of a CAD document 108. For example, the audit module 114 can generate a notification in response to determining that a space bounded by a polyline in a CAD document 108, e.g., a polyline specified in a CAD layer 112, is missing a space type field. The audit module 114 can determine that the space most likely corresponds to an "office space" type and can generate a recommendation for adding an "office space" type to this particular space. In some implementations, the audit module 114 generates a command to automatically input a value for the missing space type.

In some implementations, the audit module 114 is configured to standardize layer data of a CAD document for processing by one or more other modules or devices of the system 100. In some implementations, the audit module 114 generates an audit output from one or more groupings of CAD layers 112 based on processes performed on each of the CAD layers 112. The audit module 114 can provide the audit output to other modules in the system 100 including a data sync module 116 and a graphics sync module 118, which can both be included in the space management module 185.

As described above, the system 100 interprets and extracts graphics and data elements of a CAD document 108 at least to digitally render certain real-world items of a building for visualization to a user 104. The data sync module 116 can be configured to extract the data elements of the CAD document 108, whereas the graphics sync module 118 can be configured to extract the graphic elements of the CAD document 108. The data sync module 116 and the graphics sync module 118 can execute its respective extraction and syncing operations based on inputs that correspond to an audit output generated by the audit module 114 and the data associated with the one or more CAD documents 108.

The data sync module 116 can execute a workflow for extracting data values of layers identified in the mapping output and for generating data structures used to stage or preview information linked to groupings of layers in the mapping output. The graphics sync module 118 can execute a workflow for reading and exporting graphical (or spatial) elements of layer data for each of the layers in a grouping specified by the mapping output. In some implementations, to export this graphical data of the layers, the graphics sync module 118 calculates dimensional bounds that are used to generate layers including an interactive layer 124 and a visual layer 126. In some implementations, the interactive layer 124 is represented with a format for encoding geographic data structures such as GeoJSON, which is standardized by RFC 7946 of the Internet Engineering Task Force (IETF). In some implementations, the visual layer 126 is represented using a graphics format such as SVG. Other format types are possible. In some implementations, the respective outputs of the data sync module 116 and graphics sync module 118 can be stored in a database 120 and later accessed to generate a preview of the data and graphics for a layer or floorplan before final visual rendering. In some implementations, the respective outputs of the data sync module 116 and graphics sync module 118 can be provided to a rendering module 130.

The system 100 includes a rendering module 130 that leverages tile generation technology to graphically render data and graphics for layers specified by the layer mapping output. In this example, the rendering module 130 is coupled for communication with user interface 102 to provide output parameters (e.g., data and graphics elements) for graphically rendering information for a layer as a display output at the user interface 102. The rendering module 130 can include logic for tile generation 128, tile renderer 136, smart renderer 132, and robust renderer 134.

In some implementations, using outputs of the graphics sync module 118 and data sync module 116, rendering module 130 can generate a merged graphics layer 122 by overlaying dimensional coordinates of a GeoJSON file over dimensional coordinates of a SVG file or one or more images tiles generated from the SVG file. Rendering module 130 can adjust one or more coordinate systems associated with the layers 124, 126 to align them for concurrent presentation. Adjusting the coordinate systems can include performing one or more projections among coordinate systems. The merged graphics layer 122 can be used for presentation of the preview of the data and graphics for the layer or floorplan, presentation of a final version of the layer or floorplan, or both. In some implementations, the system 100 generates the merged graphics layer 122 based on intelligent analytics and calculations related to spatial coordinates and bounds for respective coordinate systems of the SVG file and GeoJSON file or the one or more image tiles and the GeoJSON file.

For the presentation of the merged graphics layer 122, a tile generation module 128 can generate multiple image tiles from a SVG file. The image tiles can have smaller file sizes, smaller dimensions, or both, than the SVG file. As a result, the system 100 or a device that receives the image tiles from the system 100 can require fewer resources for presentation the image tiles on the user interface 102 than if the SVG file was used for presentation of the merged graphics layer 122. For instance, when each image tile has a smaller file size, each image tile requires less memory than the memory required to store the SVG file. Further, the system 100 can send an image tile to the computing device more quickly than an SVG file because of the smaller file size.

In some implementations, a computing device that presents the user interface 102 can render the image tile more efficiently than the SVG file because of the smaller file size. When multiple image tiles depict the data for a single SVG file, the computing device can use multi-threading support, whether virtual or actual, to more quickly present the image tiles on the user interface 102 than presentation of the SVG file on the user interface 102. The computing device can use a first thread for presentation of a first image tile and a second thread for presentation of a second image tile.

The tile generation module 128 can decouple image tile generation from the graphic sync process by offloading image tile generation to a separate background process. For example, the graphics sync module 118 can extract graphic elements from a CAD document to generate an SVG file. After generation of the SVG file, the tile generation module 128 can generate the image tiles from the SVG file. Because image tile generation can take longer than the graphic element extraction process, the graphics sync module 118 can generate only an SVG file which generation process can be faster than the image tile generation. This can enable the system 100 to present the merged graphics layer 122, e.g., in the user interface 102, using an SVG file rather than image tiles more quickly than if the system 100 waited until the image tile generation process completed. Once the tile generation module 128 finishes generation of some of the image tiles, the system 100 can then use the image tiles for the merged graphics layer 122, taking advantage of the smaller file sizes of the image tiles.

The smart renderer 132 can be configured to intelligently switch between non-tile SVG files and image tiles to improve presentation of the merged graphic layers 122 in the user interface 102. In some implementations, the smart renderer 132 enables the rendering module 130 to perform its rendering functions using fewer processor cycles, less memory resources, or both, when dynamic tiling functions of the smart renderer 132 are invoked at the rendering module 130. In some implementations, the smart renderer 132 can enable presentation of the merged graphics layer 122 more quickly using an SVG file than if the merged graphics layer 122 was only presented using image tiles. Hence, the smart renderer 132 can provide improved efficiency relative to other approaches for rendering graphical data at a display.

The robust renderer 134 is configured to overlay data or dimensional coordinates of the GeoJSON file on top of the data or dimensional coordinates of the SVG file, e.g., for the merged graphics layer 122. This overlay feature of the robust renderer 134 is related to the merged graphics layer 122 and intelligent analytics functions described earlier. More specifically, the robust renderer 134 can be used to execute the intelligent analytics and calculations related to spatial coordinates and bounds for respective coordinate systems of the SVG file and GeoJSON file. The robust renderer 134 allows for cooperation between, and integration of, different coordinate systems to allow for visualization of data and graphical elements of drawing layers, e.g., when data for the merged graphics layer 122 is presented on the user interface 102.

When the merged graphics layer 122 includes an interactive GeoJSON layer and multiple image tiles, a tile renderer 136 can coordinate presentation of the GeoJSON layer with the image tiles. For instance, the tile renderer 136 can obtain x-y coordinates in a CAD screen space, e.g., for the user interface 102. The tile renderer 136 can use these coordinate to align the GeoJSON layer with the image tiles. For instance, the tile renderer 136 can convert coordinates for the GeoJSON layer into coordinates for the image tiles. Converting coordinates can include performing one or more projections among coordinate systems associated with the layers 124, 126.

Figure 2:
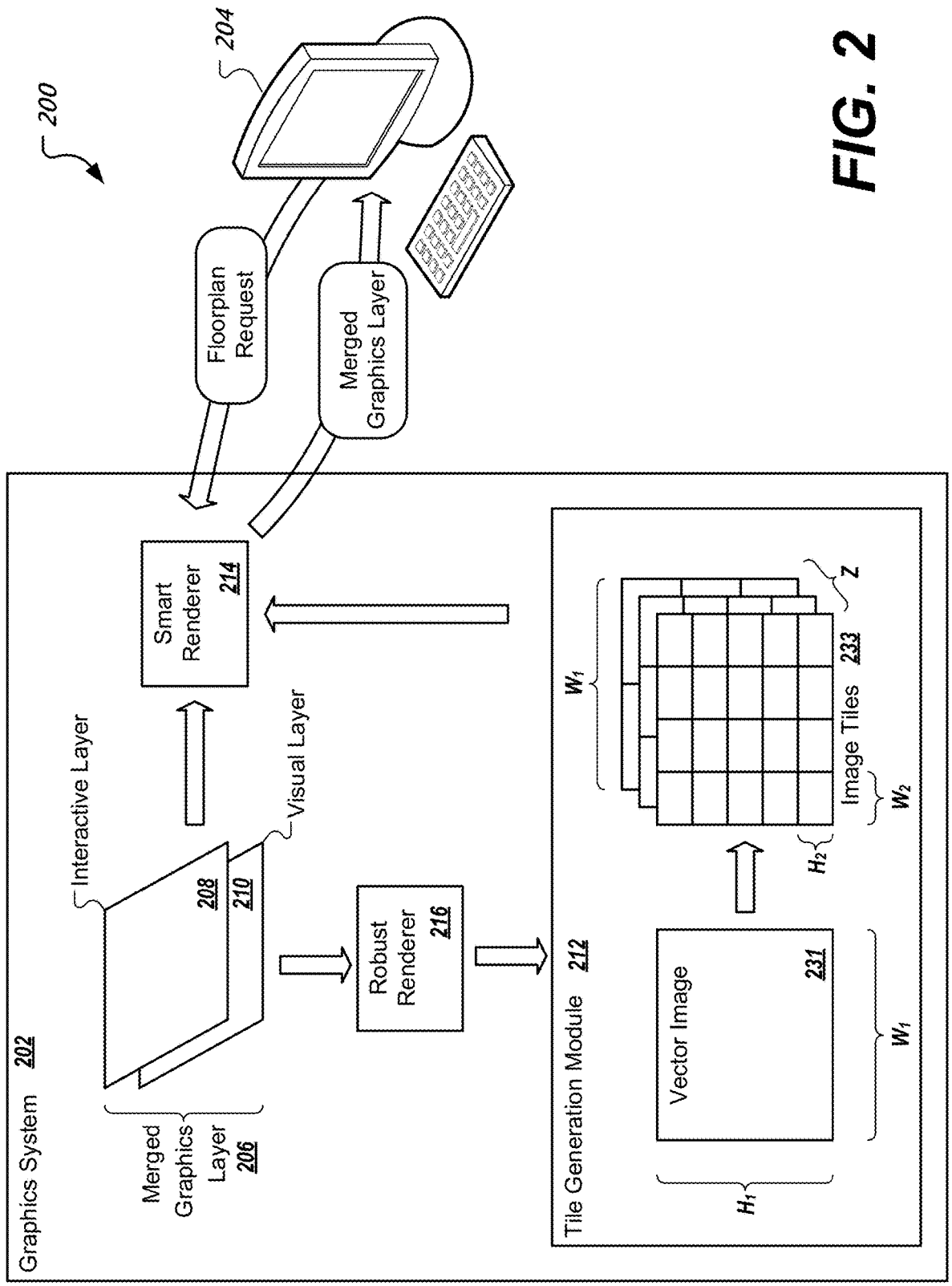
FIG. 2 shows an example of an environment in which a graphics system interacts with a user device.

FIG. 2 shows an example of an environment 200 in which a graphics system 202 interacts with a user device 204. The graphics system 202 can include a processor configured to execute a smart renderer 214, robust renderer 216, and a tile generation module 212. The graphics system 202 can be a part of the system 100 of FIG. 1 and can include a processor configured to execute one or more portions of at least the space management module 185 such as tile generation module 128, tile renderer 136, robust renderer 134, and smart renderer 132. The graphics system 202 can receive a floorplan request from the user device 204 and provide a presentation of a merged graphics layer 206 to the user device 204 that is responsive to the request.

The graphics system 202 can receive layers for a merged graphics layer 206 associated with a floorplan, including for example an interactive layer 208 and a visual layer 210, from modules such as the data sync module 116 and the graphics sync module 118 of FIG. 1. The interactive layer 208 can be configured to enable user interaction with a floorplan represented by the merged graphics layer 206 when the floorplan is presented in a user interface. The floorplan can be presented in any appropriate user interface, such as a web browser user interface, a native application user interface, or both, depending on the application that requests data for the merged graphics layer 206. When the merged graphics layer 206 is presented in a user interface on a display, e.g., for the user device 204, the interactive layer 208 can be used to process user interaction with the merged graphics layer 206.

The graphics system 202 can determine an action to perform based on the detected user interaction. For example, when the detected user interaction is a pan or a zoom operation, the graphics system 202 can determine whether to send additional image content to the user device 204, what portion of the floorplan should be depicted in the user interface, or both. The graphics system 202 can then send the appropriate data for the merged graphics layer 206 to the user device based on the detected user interaction.

The robust renderer 216 can modify, if required, one or more layers 208, 210 of the merged graphics layer 206. In some implementations, the robust renderer 216 can detect a size mismatch among the layers 208, 210. Based on detecting a size mismatch, the robust renderer 216 can resizing one or more of the layers 208, 210 of the merged graphics layer 206, and align these layers 208, 210 before presentation and user interaction occurs with the merged graphics layer 206. In some implementations, the robust renderer 216 can determine a CAD boundary layer based on outer boundaries of the layers 208, 210 that surround the content requested by the user. In some implementations, the robust renderer 216 uses the CAD boundary layer to force layers 208, 210 within a merged graphics layer 206 to have the same boundaries such that they align when presented on the user device 204. In some examples, the robust renderer 216 uses a CAD boundary layer to align a visual layer, e.g., a SVG layer, and an interactive layer, e.g., a GeoJSON layer, for presentation together on the same user device 204.

The visual layer 210 can include a vector image 231. In some implementations, the visual layer 210 can include multiple image tiles 233. For instance, depending on presentation criteria, the graphics system 202 can send a merged graphics layer 206 with a vector image 231 to the user device 204 or the graphics system 202 can send a merged graphics layer 206 with one or more image tiles 233 to the user device 204.

When the graphics system 202 provides the user device 204 with a merged graphics layer 206 that includes the vector image 231, the graphics system 202 can provide the user device 204 with data for presentation of the floorplan in a user interface. In some implementations, receipt of the merged graphics layer 206 with the vector image 231 can reduce network communications between the user device 204 and the graphics system 202 because the vector image 231 includes all image content for the floorplan. The merged graphics layer 206 can include a vector image 231 which can reduce an amount of time necessary for presentation of portions of the floorplan after the interactive layer 208 detects a zoom or a pan user interaction because the user device 204 does not need to request additional image data from the system 202.

When the graphics system 202 provides the user device 204 with a merged graphics layer 206 that includes multiple images tiles 233, the graphics system 202 can provide the user device 204 with only some of the data for presentation of a floorplan in a user interface. Receipt of the merged graphics layer 206 that includes an image tile 233 can reduce network latency, presentation latency, or both, because the image tile 233 has a smaller file size than the vector image 231. The graphics system 202 can provide the user device 204 with image tiles 233 as needed, e.g., when the interactive layer 208 detects a pan or a zoom user interaction, the system can provide the user device 204 with additional image tiles 233. In some implementations, the graphics system 202 can provide image tiles 233 to the user device 204 such that the user device 204 will store the image tiles 233 in a cache, e.g., for later retrieval as needed.

The graphics system 202 can determine whether to generate image tiles 233 for a merged graphics layer 206. The graphics system 202 can include one or more tile generation criteria, e.g., that are stored in a memory. When one or more of the tile generation criteria are satisfied, the graphics system 202 can determine to generate image tiles 233 for a merged graphics layer 206.

For instance, the graphics system 202 can determine whether a size a vector image 231 for a merged graphics layer satisfies a threshold size, e.g., as a tile generation criteria. The threshold size can be a file size, a resolution size, or a combination of both. The size of the vector image 231 can satisfy the threshold file size when the vector image 231 size is greater than, equal to, or either, the threshold file size. The threshold size can be a graphics system 202 parameter, e.g., specified based on user input.

In some implementations, the graphics system 202 can determine whether one or more parameters for the merged graphics layer 206 indicate that the graphics system 202 should generate image tiles 233 from the vector image 231. For instance, the graphics system 202 can receive multiple different merged graphics layers 206. Some of the different merged graphics layers 206 can be for different entities, e.g., can be floorplans of different buildings, floorplans for different companies, or both. A merged graphics layer 206, or an entity, can have a property that indicates whether the graphics system 202 should generate image tiles 233 from a vector image 231 for the floorplan or for all floorplans for the entity.

When the property indicates that the graphics system 202 should not generate image tiles 233 and the graphics system 202 accesses a merged graphics layer 206, e.g., in memory or received from another component, the graphics system 202 determines to skip generating image tiles 233 for the merged graphics layer 206. The graphics system can then store, or maintain, a merged graphics layer 206 with a vector image 231 as the visual layer 210 in memory, send such a merged graphics layer 206 to the user device upon receipt of a floorplan request from a user device 204, or both.

When the property indicates that the graphics system 202 should generate image tiles 233 and the graphics system 202 accesses a merged graphics layer 206, the graphics system 202 provides an instruction to the tile generation module 212 that causes the tile generation module 212 to generate the image tiles 233 from the vector image 231. This can occur after the graphics system 202 generates the vector image 231, e.g., in response to generation of the vector image 231, or at another appropriate time.

The tile generation module 212 can generate the image tiles 233 using the vector image 231. Each of the image tiles 233 can have a smaller file size than the vector image 231. For instance, when the vector image 231 has a file size of 40 MB, each of the image tiles 233 can have a file size of approximately 4 MB.

In some examples, some of the image tiles can have a different file size, resolution size, or both, than other image tiles. For instance, the tile generation module 212 can generate image tiles 233 for one or more edges of the image content that have a size than the other image tiles. The image tiles with the different file size, resolution size, or both, can be the image tiles on the bottom edge of the image content, the right edge of the image content, the top edge of the image content, the left edge of the image content, or a combination of two or more of these. For example, the tile generation module 212 can generate image tiles for the bottom and right edges that have different sizes.

The tile generation module 212 can select the resolution for each of the image tiles 233. The resolution can be a predefined resolution. The predefined resolution can be the same for all image tiles generated for all merged graphics layers 206, or for all image tiles generated for a particular entity. For instance, the tile generation module 212 can select a resolution of 1024 pixels by 1024 pixels.

The tile generation module 212 generates a first zoom layer of image tiles 233 using the resolution. For instance, the tile generation module 212 can determine a pixel size for the vector image 231. The pixel size can have a first height $H_1$ and a first width $W_1$.

The tile generation module 212 can divide the vector image 231 into portions using the resolution and the pixel size for the vector image 231 such that each portion will correspond to an image tile. The pixel size for the vector image 231 can be a width and a height for the vector image 231, e.g., specified by style data for the vector image 231. For example, the tile generation module 212 can determine "ideal" height and width values for the vector image 231 from a rect tag for the vector image 231 and use the idea values for the pixel size for the vector image 231.

The tile generation module 212 can generate the image tiles 233 for the first zoom layer such that each of the image tiles 233 depicts a corresponding one of the portions of the content from the vector image 231. One or more of the image tiles 233 has a second height $H_2$ and a second width $W_2$ that are smaller than respective dimensions of the pixel size for the vector image 231, e.g., the first height $H_1$ and the first width $W_1$.

When the vector image 231 has a pixel size of 7680 pixels by 4320 pixels, the tile generation module 212 can generate forty image tiles 233 for the first zoom layer, e.g., for a grid that has a width of eight image tiles by a height of five image tiles. In this example, the image tiles 233 form a grid that is 8192 pixels by 5120 pixels, e.g., and larger than the pixel size for the vector image 231. To account for the differences in resolution, the tile generation module 212 can create one or more image tiles 233 that have a height and a width that are less than the second height $H_2$ and the second width $W_2$. For instance, the tile generation module 212 can generate a row of image tiles 233 for the image content on the bottom of the vector image 231 that have a height of 224 pixels. The tile generation module 212 can generate a column of image tiles 233 for the image content on the right of the vector image 231 that have a width of 512 pixels.

The tile generation module 212 can determine a number of zoom levels for the vector image 231 by generating tiles for the vector image 231 based on the pixel size for the vector image 231. The tile generation module 212 can then generate one or more image tiles 233 for a second zoom layer. The tile generation module 212 determines an updated pixel size for the second zoom level for the vector image 231 by dividing the pixel size, e.g., the height and the width, by a value to determine the pixel dimensions for the next zoom level for the vector image 231. For instance, the tile generation module 212 can divide the height and the width by two to determine an updated pixel size for the vector image 231 for the second zoom layer. The tile generation module 212 can then generate image tiles 233 for the vector image 231 using the updated pixel size. The tile generation module 212 can repeat this process until the tile generation module 212 generates a single tile that represents the content depicted in the vector image 231.

The tile generation module 212 repeats this process for multiple zoom layers Z until the tile generation module 212 determines that a threshold criterion has been satisfied. For instance, the tile generation module 212 repeats this process until the tile generation module 212 generates a single image tile for the most zoomed out layer. In some examples, when a tile size is within a threshold distance of a threshold tile size for which a single image tile depicts all of the content in the vector image 231, the tile generation module 212 can determine to generate the single image tile that depicts all of the content in the vector image 231 and to stop generating other image tiles for additional zoom layers Z.

In some implementations, each of the images tiles 233 can have multiple coordinates that identify the image tile 233. For instance, a first coordinate, e.g., a z coordinate, can indicate a zoom layer to which the image tile 233 belongs. A second coordinate, e.g., an x coordinate, and a third coordinate, e.g., a y coordinate, can indicate a location for the image tile in the zoom layer. For instance, the second and third coordinates can indicate where a predetermined location of the image tile 233, e.g., the top left corner of the image tile, is with respect to the other image tiles 233 in the zoom layer. This location can be, for instance, at (0,0), (0,1024), or (1024,1024) to name a few examples.

When determining image content to present in a user interface, a device or system can use the coordinates to select one or more image tiles. For instance, the graphics system 202, e.g., the interactive layer 208, can determine a zoom level out of multiple zoom levels, e.g., a first zoom level, for the z coordinate. The graphics system 202 can determine an area of the floorplan that will be depicted in the user interface. The graphics system 202 determines this area using the x-y coordinates for the screen. This can include the x-y coordinates for the top-left corner of the screen, the bottom-right corner of the screen, both, or some other combination of one or more coordinates. The graphics system 202 can determine, using the x-y coordinates for the image tiles, which image tiles for the determined zoom level have x-y coordinates that overlap with the x-y coordinates of the area that will be presented in the user interface. The graphics system 202 can then provide the determined image tiles to the user device 204 for presentation.

Some of the image tiles 233 depict sub-portion of the floorplan while the vector image 231 can depict the entire floorplan. For example, a most zoomed out image tile 233 can depict the entire floorplan while having a smaller file size than the vector image 231. The image tiles 233 other than the most zoomed out image tile 233 can each depict only a portion of the floorplan. For instance, for a zoom level that includes four image tiles, a first image tile can depict the top left portion of the floorplan, a second image tile can depict the top right portion of the floorplan, a third image tile can depict the bottom left portion of the floorplan, and a fourth image tile can depict the bottom right portion of the floorplan. In this way, all of the image tiles 233 have a smaller file size than the vector image 231, and depict at least a portion of the content from the vector image 231, while all of the image tiles 233 for a particular zoom layer depict all of the content from the vector image 231, e.g., though potentially at a different level of detail.

In some implementations, the tile generation module 212 can determine the resolution for the image tiles 233 using a pixel size of the vector image 231. For instance, the tile generation module 212 can balance the number of image tiles that would be generated for a vector image 231 with the size of the individual tiles. As a result, the tile generation module 212 can adjust the image tile 233 resolution to adjust a total number of image tiles 233 necessary for a vector image 231, an amount of memory in which the image tiles 233 can be stored, or both.

The tile generation module 212 can store the vector image 231, the image tiles 233, or both, in memory. The tile generation module 212 can store data that identifies the merged graphics layer 206 to which the vector image 231, the image tiles 233, or both, belong. The data can be an identifier for the merged graphics layer 206 or other appropriate data.

In some examples, after generating the image tiles 233 for a merged graphics layer 206, the graphics system 202 discards the vector image 231 from which the image tiles 233 were generated. For instance, the graphics system 202 can delete, from memory, a vector image 231 233 in response to completing generation of the multiple image tiles 233 using the vector image 231.

When the graphics system 202 receives a floorplan request from a user device 204, the smart renderer 214 determines whether one or more presentation criteria for presenting image tiles 233 are satisfied. In some implementations, the smart renderer 214 determines an identifier for the floorplan requested by the user device 204. The smart renderer 214 determines a merged graphics layer 206 for the floorplan using the floorplan identifier. This can include the smart renderer 214 determining the interactive layer 208 and the visual layer 210 for the merged graphics layer 206 using the floorplan identifier. In some implementations, the smart renderer 214 passes the layers 208, 210 to the robust renderer 216 for resizing, align, or both before presenting the merged graphics layer 206.

When the smart renderer 214 determines that some or all of the presentation criteria are satisfied, the graphics system 202 can provide the user device 204 with the merged graphics layer 206 that includes the interactive layer 208 and one or more of the image tiles 233 for the merged graphics layer 206. The graphics system 202 might not provide the user device 204 with all of the image tiles 233 for the merged graphics layer 206 at the same time but rather can provide the user device 204 with a subset of the image tiles 233 for the merged graphics layer 206. For example, the smart renderer 214 or another component in the graphics system 202 can determine a portion of the floorplan that should initially be presented on a user interface for the user device 204. The smart renderer 214 then determines the image tiles 233 that depict the content included in the portion of the floorplan. The graphics system 202 then provides, to the user device 204, the determined image tiles 233 that depict the content included in the portion of the floorplan. The portion of the floorplan can be the entire floorplan, e.g., for a most zoomed out image tile, a previously depicted portion of the floorplan for the user device 204, or another appropriate portion of the floorplan.

A presentation criterion can include one or more properties for the merged graphics layer 206 that indicate whether the graphics system 202 should generate image tiles 233 for the vector image 231. These properties can indicate whether tiling is enabled for the merged graphics layer 206, for an entity associated with the merged graphics layer 206, or both. An entity associated with a merged graphics layer 206 can be an organization or a building to which the merged graphics layer 206 applies. For instance, a building can have multiple merged graphics layers 206, one for each floor or another area within the building, and the presentation criteria can be the same for each floor or other area within the building. The smart renderer 214 can determine that the presentation criteria are satisfied when the one or more properties indicate that tiling is enabled for the merged graphics layer 206.

Whether or not the presentation criteria include one or more properties for the merged graphics layer 206, the smart renderer 214 can determine whether one or more image tiles 233 have been generated for the merged graphics layer 206, e.g., as another presentation criteria. This can include the smart renderer 214 determining whether one or more image tiles 233 have been generated for a portion of the merged graphics layer 206 that would be presented in a user interface. The smart renderer 214 can determine this portion using data included in the floorplan request received from the user device 204, e.g., that indicates which parts of the floorplan will be initially presented in the user interface.

The smart renderer 214 can determine whether a threshold quantity of image tiles 233 have been generated for the merged graphics layer 206. The threshold quantity can be determined to reduce a likelihood that the user device 204 will request an image tile that has not yet been generated by the tile generation module 212.

In situations when the smart renderer 214 determined that the presentation criteria are satisfied and to send image tiles 233 to the user device, but an image tile required for presentation in the user interface is not yet generated, e.g., for a subsequent image tile request, the smart renderer 214 can determine that the vector image 231 should be sent to the user device instead of sending more image tiles 233 to the user device 204.

This can occur when the smart renderer 214 initially determines to send image tiles 233 to the user device 204 even though only some of the image tiles for the merged graphics layer 206 have been generated. As the interactive layer 208 detects user interaction with the merged graphics layer 206, the graphics system 202 can send additional image tiles to the user device 204 for presentation in the user interface, e.g., in response to requests generated using data from the interactive layer 208 implemented on the user device 204. One of these later requests can include a request for presentation of an image tile 233 that the tile generation module 212 has not generated, either finished generating or even begun generating. As a result, the graphics system 202 does not have an image tile of the appropriate resolution to send to the user device 204. Because of this, the smart renderer 214 can determine to send, to the user device 204, image tiles for a different resolution, e.g., a higher or lower resolution, the vector image 231, or both.

For instance, the smart renderer 214 can determine to initially send image tiles 233 of a different resolution to the user device 204. While the user device 204 presents the image tiles 233 of a different resolution than the requested image tile 233, the smart renderer 214 can cause the graphics system 202 to send the vector image 231 to the user device 204. This can enable the user device 204 to present content more quickly, e.g., using the image tiles of the different resolution, while the user device 204 receives the vector image 231 that the user device 204 can then use for presentation of the floorplan in the user interface.

In some implementations, the presentation criteria can include criteria for properties of the user device 204, a display that will present the user interface that includes data from the merged graphics layer 206, or both. For instance, the presentation criteria can include a minimum number of processor cores, a minimum processor speed, a minimum amount of random access memory (RAM), a minimum amount of available RAM, a minimum display resolution, a maximum display resolution, a network bandwidth, whether the user device 204 includes an integrated or separate graphics processor, or a combination thereof. The presentation criteria for a processor can be for a central processing unit, a graphics processing unit, or both.

When the smart renderer 214 determines that the user device 204 presentation criteria are satisfied, the smart renderer 214 determines to cause the graphics system 202 to provide image tiles 233 to the user device 204. This can occur when the user device's 204 processor has fewer cores than the minimum number of cores, processor has a speed that is less than the minimum processor speed, an amount of RAM is less than the minimum amount of RAM, an amount of available RAM is less than the minimum amount of available RAM, network bandwidth is less than the network bandwidth requirement, or a combination of two or more of these, to name a few examples. In some examples, the smart renderer 214 can determine that the presentation criteria are satisfied when the user device 204 has an integrated graphics processor that is part of the user device's 204 central processing unit, e.g., instead of a graphics processing unit separate from the central processing unit.

The graphics system 202 is an example of a system implemented as computer programs on one or more computers in one or more locations, in which the systems, components, and techniques described in this document are implemented. The user device 204 may include personal computers, mobile communication devices, and other devices that can send and receive data over a network. The network (not shown), such as a local area network (LAN), wide area network (WAN), the Internet, or a combination thereof, connects the user device 204, and the graphics system 202. The graphics system 202 may use a single server computer or multiple server computers operating in conjunction with one another, including, for example, a set of remote computers deployed as a cloud computing service.

The various functional components of the graphics system 202 may be installed on one or more computers as separate functional components or as different modules of a same functional component. For example, the tile generation module 212, the smart renderer 214, and robust renderer 216 both, can be implemented as computer programs installed on one or more computers in one or more locations that are coupled to each through a network. In cloud-based systems for example, these components can be implemented by individual computing nodes of a distributed computing system.

Figure 3:
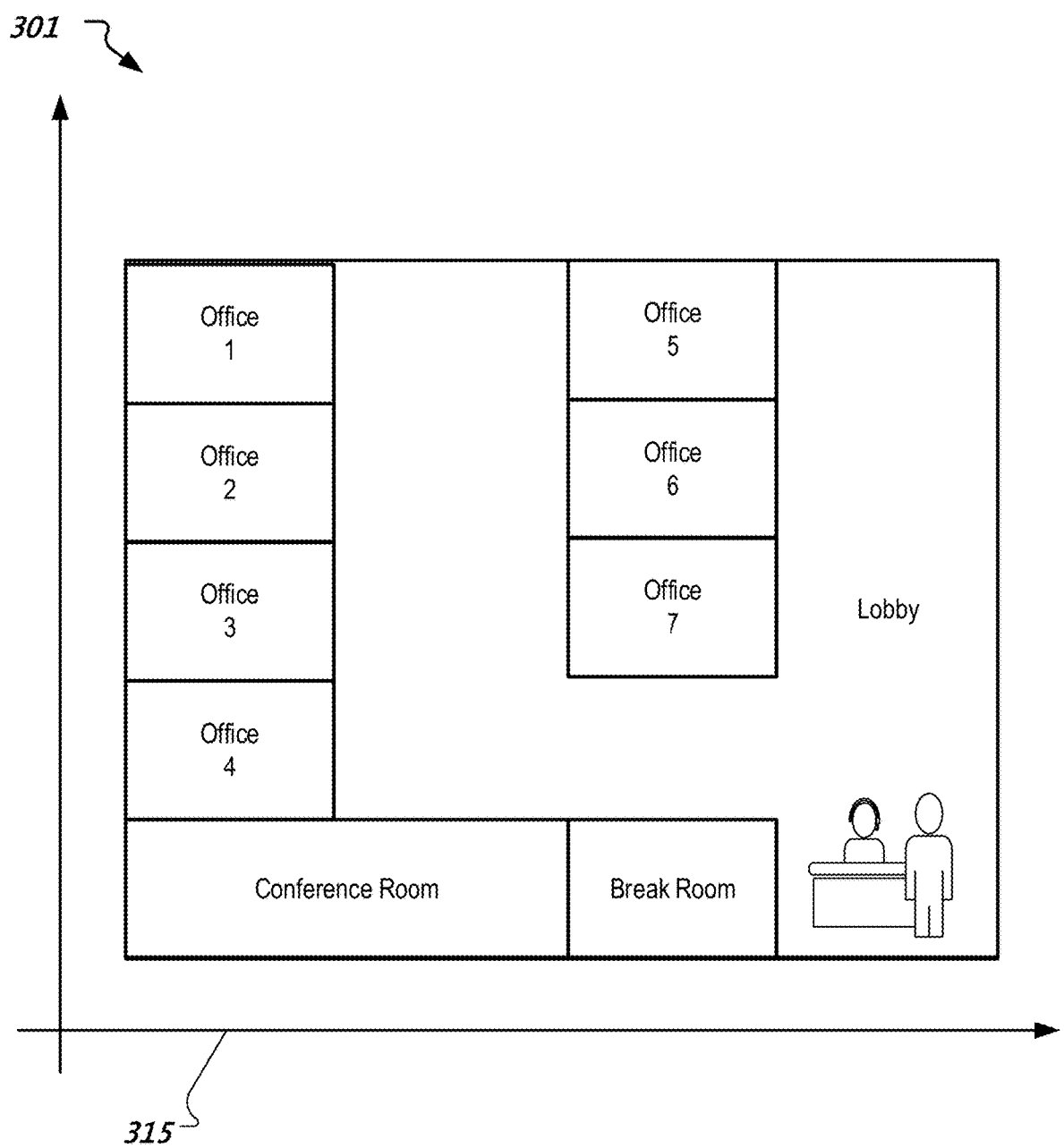
FIG. 3 shows a layout of an example of a floorplan that is provided by a visual layer.

FIG. 3 shows a layout of an example of a floorplan that is provided by a visual layer 301. In some implementations, the visual layer 301 provides a representation of the floorplan via an image file such as a SVG file. The visual layer 301 can be described using a coordinate system 315. For example, points within the visual layer 301 can be defined according to a Cartesian coordinate system. Other types are systems can be used.

As shown in the example of FIG. 3, the floorplan includes multiple difference regions such as private office, restrooms, and a lobby area. In some implementations, a region in the floorplan is bounded by a polyline, which is a continuous line made up of multiple line segments (e.g., line segments that denote a space such as an office or conference room). Each region can be associated with one or more data elements, e.g., space code, space name, and space type. A space code, e.g., a unique identifier such as a number, alphanumerical representation, or string, can be assigned to each region. Further, a space name, e.g., the name of a space, such as Office 3, can also be assigned to each region. Finally, a space type, e.g., the type (i.e., purpose) of a space in a building can be assigned to each region.

Figure 4:
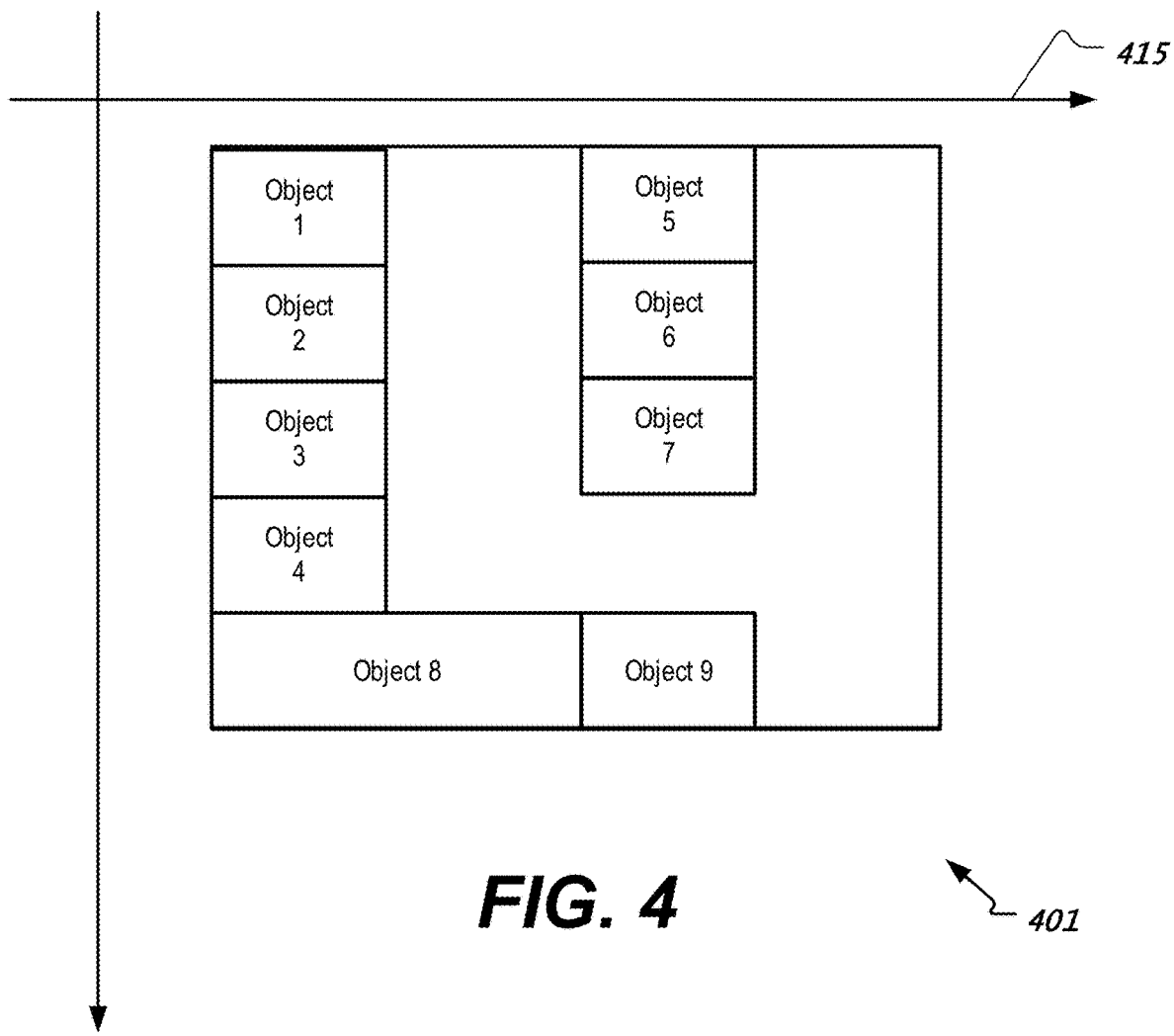
FIG. 4 shows a layout of objects which is provided by an interactive layer which is associated with the floorplan and visual layer of FIG. 3.

FIG. 4 shows a layout of data objects provided by an interactive layer 401 which is associated with the floorplan and visual layer 301 of FIG. 3. The interactive layer 401 can be described using a coordinate system 415. For example, points within the interactive layer 401 can be defined according to a geographical coordinate system. Other types are systems are possible. Points of geographical coordinate system can be expressed in terms of latitude and longitude values. The coordinate system 415 can be different from the coordinate system 315 associated with the visual layer 301. For example, the coordinate systems 315, 415 can be of different types, e.g., Cartesian or geographical), have different origins, or both.

The data objects (labelled 1-9) correspond to regions shown in FIG. 3. For example, "Object 1" corresponds to "Office 1" in FIG. 3. In some implementations, the interactive layer 401 is constructed from descriptions in a GeoJSON file. For example, the GeoJSON file can include a description for Object 1 which contains coordinates that define a perimeter of Object 1 and can include additional attributes. These objects can enable mapping of user inputs, e.g., mouse clicks, to a corresponding region of the floorplan. For example, a mouse click in the rectangular area defined by the description of Object 1 can cause an action to be performed on Office 1 such as zooming to Office 1 or assigning a person to Office 1.

Figure 5A:
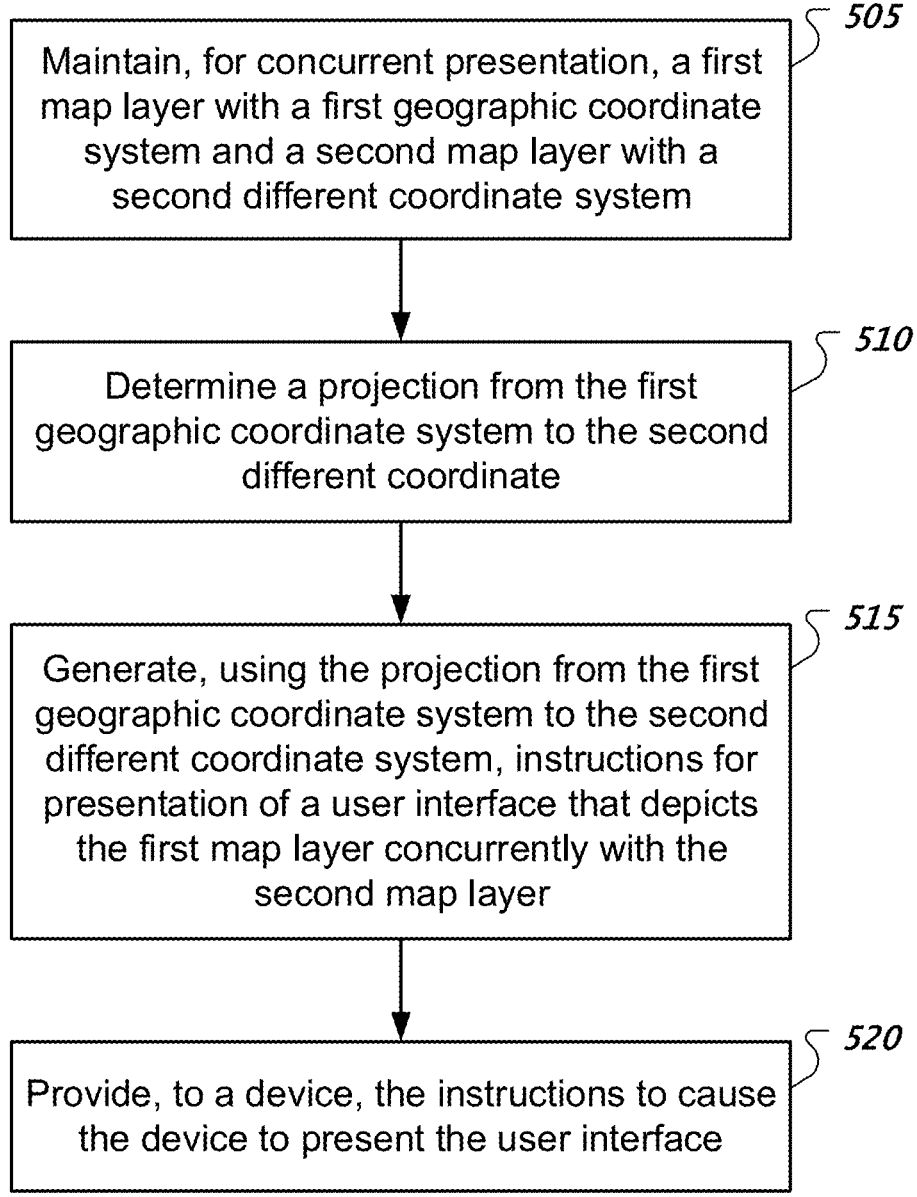
FIG. 5A shows a flowchart of an example of a process that makes adjustments between different coordinates systems associated with different maps and provides a user interface based on the adjustments.

FIG. 5A shows a flowchart of an example of a process 501 that makes adjustments between different coordinates systems associated with different maps and provides a user interface based on the adjustments. The process 501 can be performed by one or more processors (e.g., processor 802 of FIG. 8). At 505, the processor maintains, for concurrent presentation, a first map layer with a first geographic coordinate system and a second map layer with a second different coordinate system. A coordinate system is a set of mathematical rules for specifying how coordinates are to be assigned to points, such as: affine, cylindrical, Cartesian, ellipsoidal, linear, polar, spherical, vertical, etc. In some implementations, the first map layer is a GeoJSON layer. In some implementations, the first geographic coordinate system includes latitude and longitude coordinates.

In some implementations, the second map layer is an image tile layer. In some implementations, the second map layer includes an image layer that depicts content of a floorplan. A floorplan is, for example, a map for an area, such as a building or a park, which include information for multiple different levels or a single level. A floorplan can include data for a single level within a multilevel area, e.g., a single floor in a building. In some implementations, the second coordinate system includes a Cartesian coordinate system. The image layer can include one or more image tiles. A set of multiple image tiles, e.g., two or more, together can depict a floor plan for a particular zoom level of the floor plan. Each image tile can individually depict some content for the floor plan at the particular zoom level, has a tile size that is the same as the other tiles and a file size smaller than a vector image file size.

At 510, the processor determines a projection from the first geographic coordinate system to the second different coordinate system. Determining the projection can include determining one or more projections. In some implementations, one or more projections can transform points with respect to a reference coordinate system. In some implementations, determining a projection can include performing the process 701 of FIG. 7.

At 515, the processor generates, using the projection from the first geographic coordinate system to the second different coordinate system, instructions for presentation of a user interface that depicts the first map layer concurrently with the second map layer. In some implementations, the different map layers can be combined to form a merged graphics layer, which is subsequently presented. Instructions for presentation of a user interface can include information to render, among other things, images, text, menu options, and user controls in a software application such as a web browser. Instructions can also include information to process user interaction with an image, e.g., information to convert a mouse click into a relevant point on a coordinate system. At 520, the processor provides, to a device, the instructions to cause the device to present the user interface. In some implementations, providing the instructions can include sending instructions in accordance with a web-based protocol such as Hypertext Markup Language (HTML), JavaScript, or both. Other protocols are possible. In some implementations, providing the instructions including sending instructions to a remote desktop application. In some implementations, the processor is a component of the device. In some implementations, the processor is physically separate from the device.

Figure 5B:
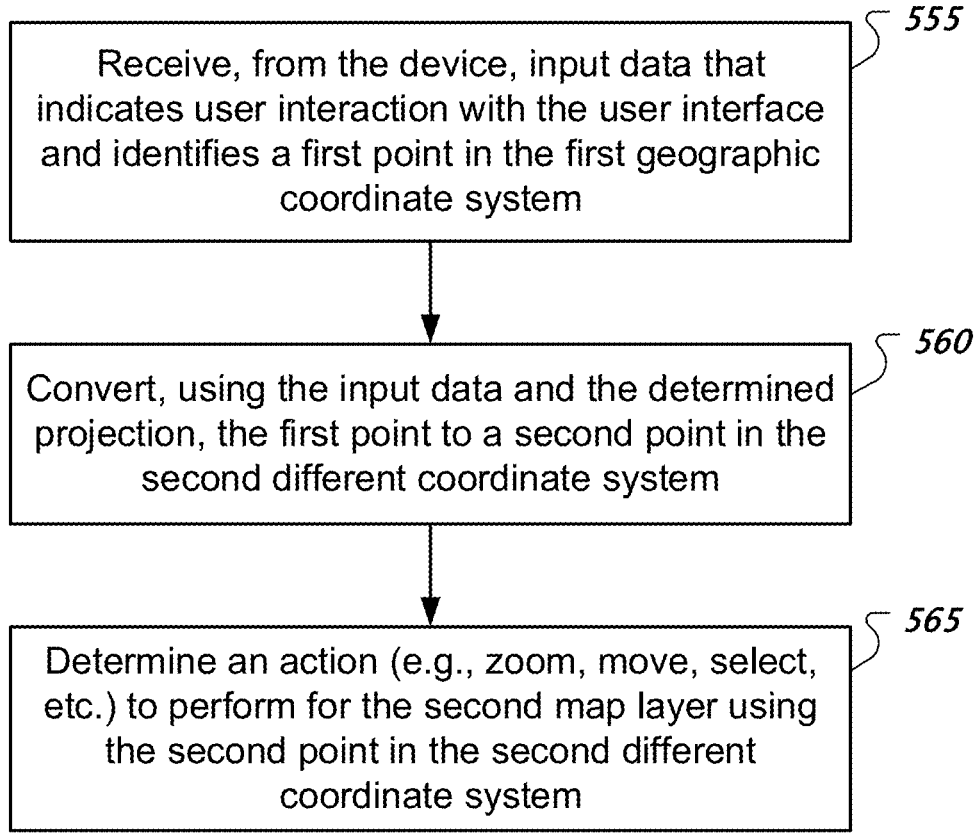
FIG. 5B shows a flowchart of an example of a process that handles user interactions via a user interface provided by the process of FIG. 5A.

FIG. 5B shows a flowchart of an example of a process 551 that handles user interactions via a user interface provided by the process 501 of FIG. 5A. The process 551 can be performed by one or more processors (e.g., processor 802 of FIG. 8). In some implementations, the processes 501, 551 are performed within the same process. At 555, the processor receives, from the device, input data that indicates user interaction with the user interface and identifies a first point in the first geographic coordinate system. In some implementations, input data can include coordinates associated with a touchscreen input, mouse click, or stylus input. Other types of input are possible. At 560, the processor, using the input data and the projection determined at 510, converts the first point to a second point in the second different coordinate system. At 565, the processor determines an action to perform for the second map layer using the second point in the second different coordinate system. Various examples of actions include zoom, move, and select. Other examples are possible.

Figure 6:
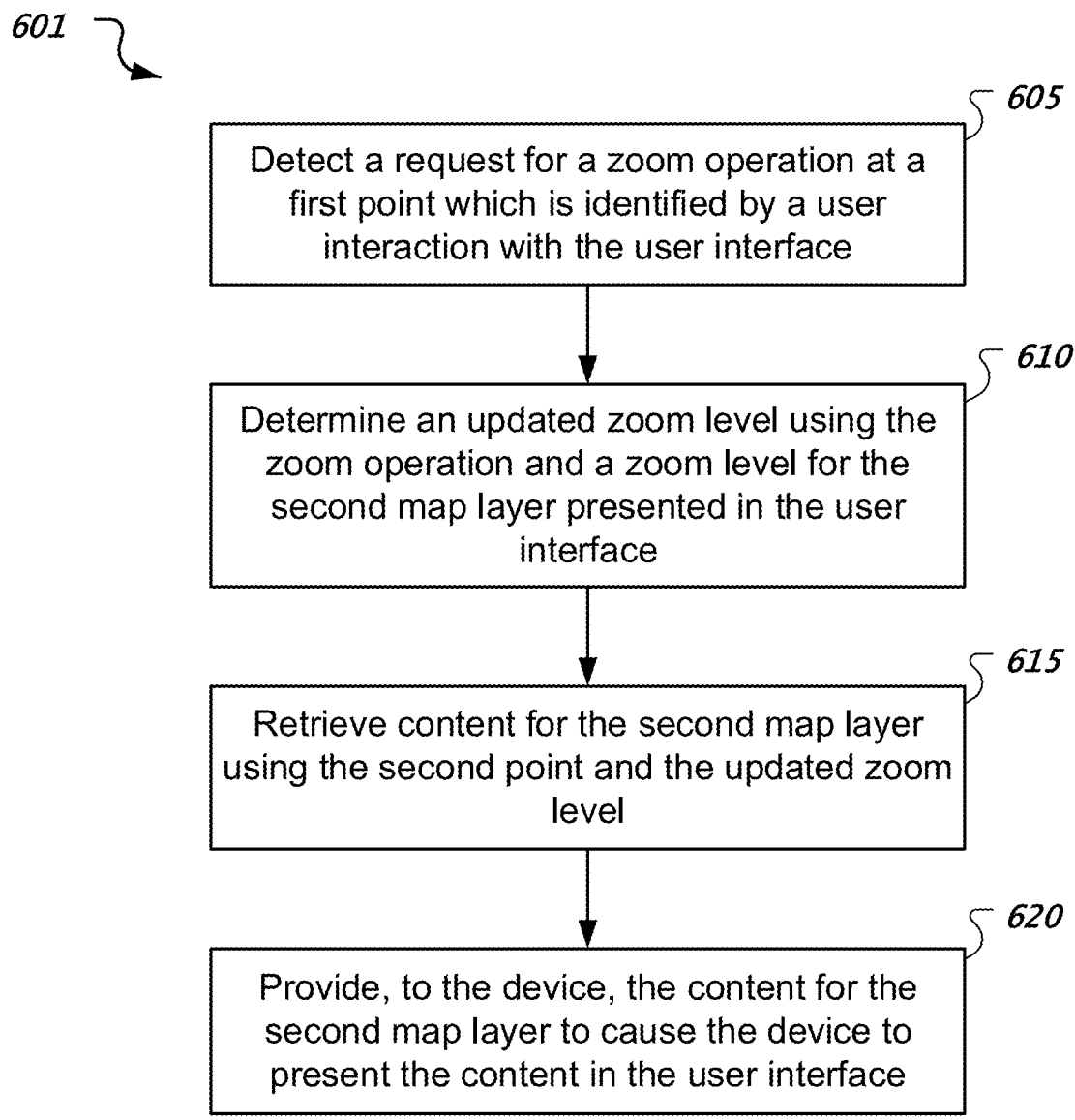
FIG. 6 shows a flowchart of an example of a process that handles a request for a zoom operation.

FIG. 6 shows a flowchart of an example of a process 601 that handles a request for a zoom operation. The process 601 can be performed by one or more processors (e.g., processor 802 of FIG. 8). At 605, the processor detects a request for a zoom operation at a first point which is identified by a user interaction with the user interface. For example, a particular touch gesture can indicate a zoom request. A mouse click, key press, or both can be used to trigger a zoom request. At 610, the processor determines an updated zoom level using the zoom operation and a zoom level for the second map layer presented in the user interface.

At 615, the processor retrieves content for the second map layer using the second point and the updated zoom level. In some implementations, retrieving the content includes retrieving an image tile for the second map layer that depicts data for the second point at the updated zoom level. Retrieving the image tile can include retrieving an image tile that has a first coordinate that represents the updated zoom level and one or more second coordinates that encompass the second point. At 620, the processor provides, to the device, the content for the second map layer to cause the device to present the content in the user interface. Providing the content at 620 can include providing, to the device, an image tile for the second map layer to cause the device to present the image tile in the user interface.

Figure 7:
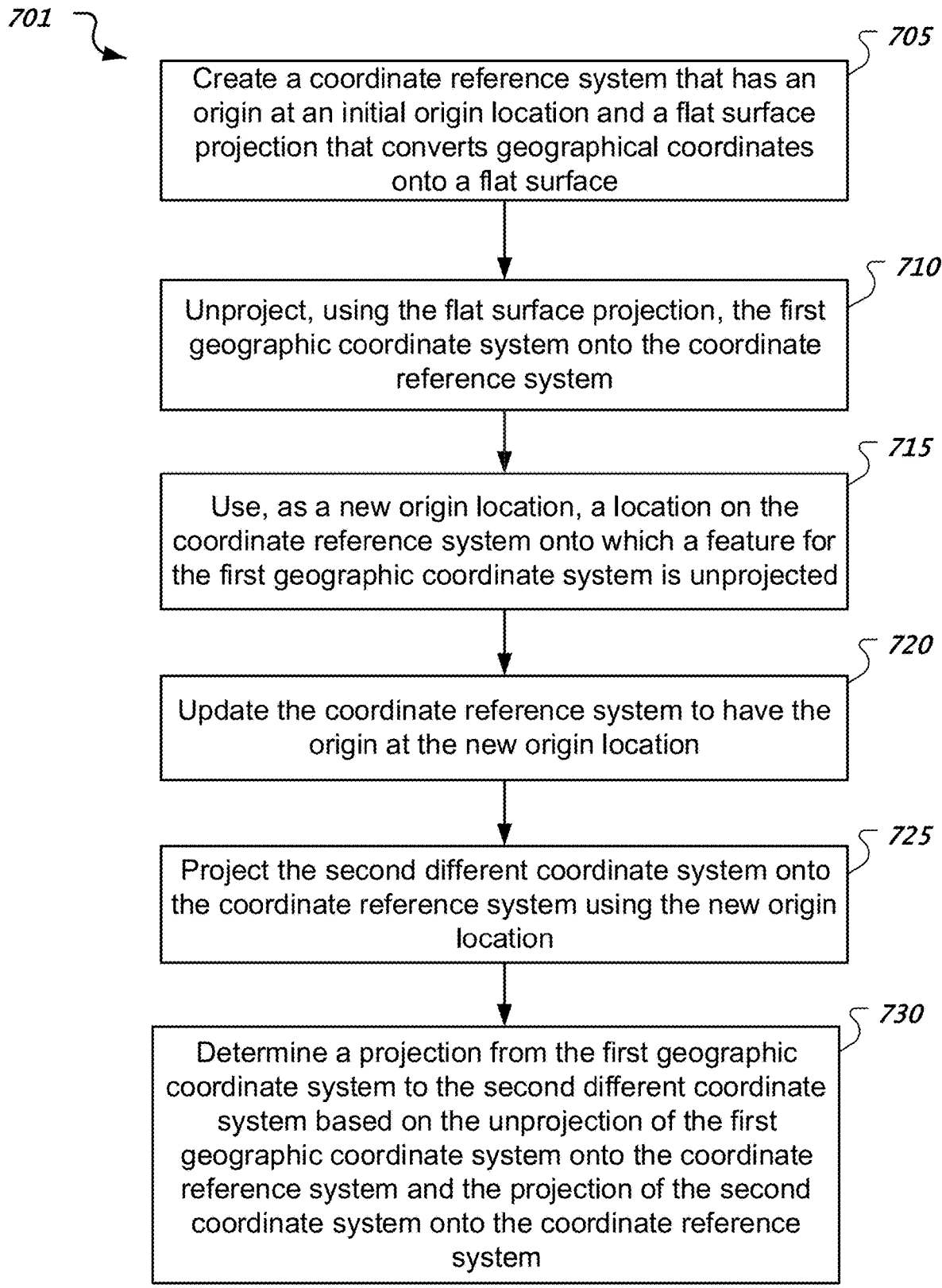
FIG. 7 shows a flowchart of an example of a process to determine a projection between different geographic coordinate systems.

FIG. 7 shows a flowchart of an example of a process 701 to determine a projection between different geographic coordinate systems. The process 701 can be performed by one or more processors (e.g., processor 802 of FIG. 8). At 705, the processor creates a coordinate reference system that has an origin at an initial origin location and a flat surface projection that converts geographical coordinates onto a flat surface. In some implementations, the initial origin location is at <0, 0> (both the x-value and y-value are zero). Creating the coordinate reference system can include creating the coordinate reference system that has the origin at the initial origin location and a flat surface projection that converts geographical coordinates onto a flat surface; and inverting a vertical axis in the coordinate reference system. In some implementations, the inverting is based on one or more identifiers for one or more image tiles to align increasing values in the same direction. Inverting the vertical axis in the coordinate reference system can include inverting a y-axis in the coordinate reference system.

At 710, the processor unprojects, using the flat surface projection, the first geographic coordinate system onto the coordinate reference system. Unprojecting can include taking a coordinate in a layer and converting it to a point <x, y> on the screen. In some implementations, an unprojection is created via projecting a two-dimensional point into a geographical location.

At 715, the processor uses, as a new origin location, a location on the coordinate reference system onto which a feature for the first geographic coordinate system is unprojected. Using, as the new origin location, the location on the coordinate reference system onto which the feature for the first geographic coordinate system is unprojected can include using, as the new origin location, the location on the coordinate reference system onto which a top, left corner of the first map layer for the first geographic coordinate system is unprojected. The new origin location is different from the initial origin. Thus, if the initial origin location is at <0, 0>, then the new origin location is at <x, y>, where x is not zero, y is not zero, or both are not zero.

At 720, the processor updates the coordinate reference system to have the origin at the new origin location. In some implementations, creating the coordinate reference system that has the origin at the initial origin location includes creating the coordinate reference system that has the origin at the initial origin location with a first coordinate for a first axis and a second coordinate for a second axis. Updating the coordinate reference system to have the origin at the new origin location can include updating the coordinate reference system to have the origin at the new origin location with a third coordinate for the first axis and a fourth coordinate for the second axis, the third coordinate being a different coordinate than the first coordinate and the fourth coordinate being a different coordinate than the second coordinate.

At 725, the processor projects the second different coordinate system onto the coordinate reference system using the new origin location. In some implementations, a projection is created via projecting geographical coordinates into a two-dimensional point. In some implementations, the processor uses a library such as a JavaScript library, e.g., Leaflet which is available from www.leafletjs.com, that provides, among other methods, a project method and an unproject method.

At 730, the processor determines a projection from the first geographic coordinate system to the second different coordinate system. Determining the projection can include using the unprojection (from step 710) of the first geographic coordinate system onto the coordinate reference system and the projection (from step 725) of the second different coordinate system onto the coordinate reference system. In some implementations, determining the projection at 730 includes determining multiple projections for different coordinate systems. For example, determining the projection can include determining a first projection for a first floorplan from the first geographic coordinate system to the second different coordinate system and determining a second projection for a second floorplan from a third geographic coordinate system for a third may layer to a fourth different coordinate system for a fourth map layer, the second floorplan being a different floorplan than the first floorplan. In some implementations, the determined projection can control placement of tiles during a presentation, the x and y coordinates for the screen space, tile layer alignment, or a combination thereof.

Figure 8:
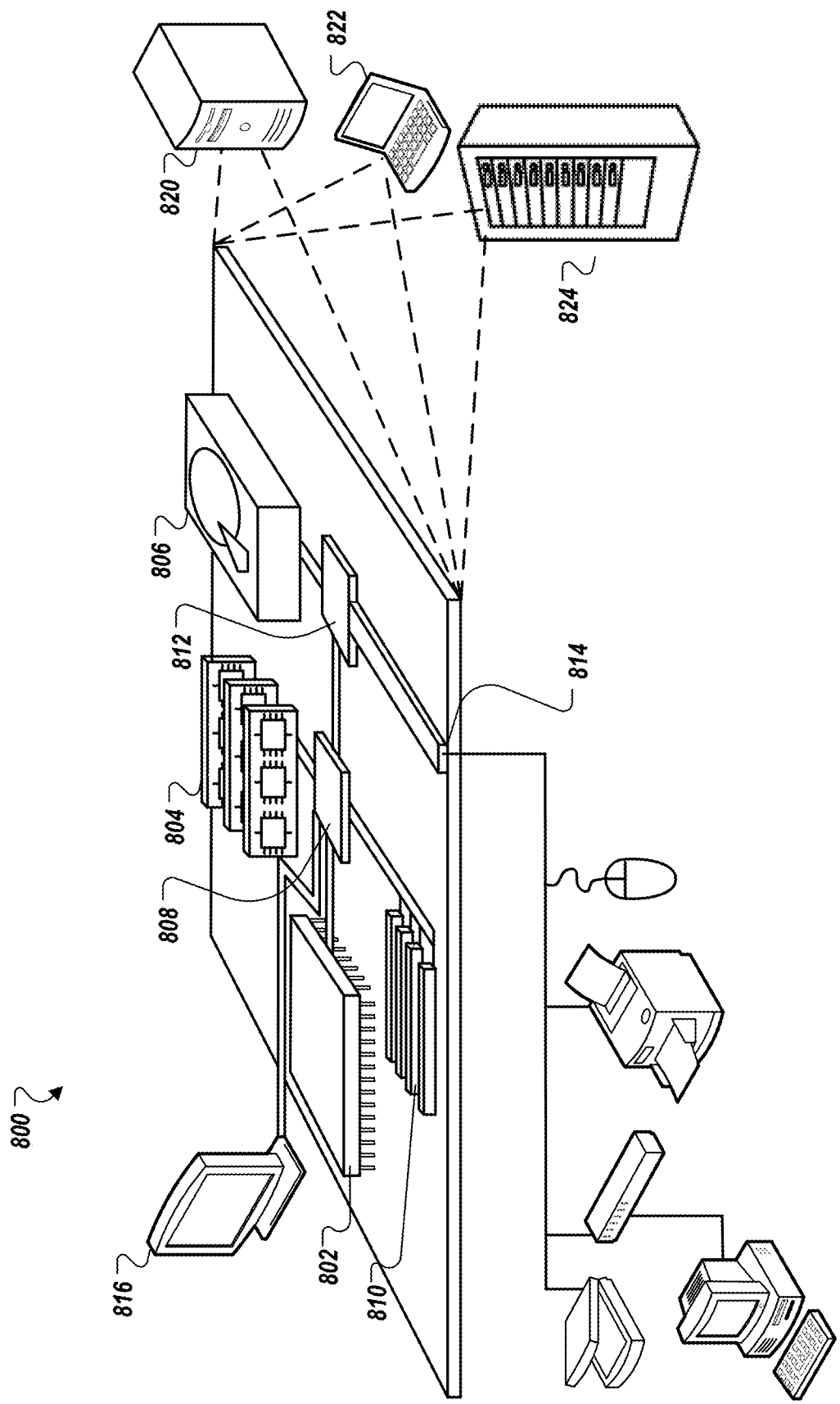
FIG. 8 shows a diagram of an example of a computing device.

FIG. 8 shows a diagram of an example of a computing device 800 which can be used to implement one or more of the systems and techniques described herein, as either a client, clients, server, servers, etc. In some implementations, the computing device 800 is referred to as a data processing apparatus. Computing device 800 is intended to represent various forms of digital computers, such as laptops, mobile devices, desktops, workstations, personal digital assistants, servers, blade servers, mainframes, and other appropriate computers. The components shown here, their connections and relationships, and their functions, are meant to be exemplary only, and are not meant to limit implementations described and/or claimed in this document.

Computing device 800 includes a processor 802, memory 804, a storage device 806, a high-speed interface 808 connecting to memory 804 and high-speed expansion ports 810, and a low-speed interface 812 connecting to low-speed bus 814 and storage device 806. Each of the components 802, 804, 806, 808, 810, and 812, are interconnected using various busses, and can be mounted on a common motherboard or in other manners as appropriate. The processor 802 can process instructions for execution within the computing device 800, including instructions stored in the memory 804 or on the storage device 806 to display graphical information for a GUI on an external input/output device, such as display 816 coupled to high-speed interface 808. In other implementations, multiple processors and/or multiple buses can be used, as appropriate, along with multiple memories and types of memory. Also, multiple computing devices 800 can be connected, with each device providing portions of the necessary operations (e.g., as a server bank, a group of blade servers, or a multi-processor system).

The memory 804 stores information within the computing device 800. In one implementation, the memory 804 includes a computer-readable medium such as a flash memory. In one implementation, the memory 804 includes a volatile memory unit or units such as RAM. In another implementation, the memory 804 includes a non-volatile memory unit or units.

The storage device 806 is capable of providing mass storage for the computing device 800. In one implementation, the storage device 806 is a computer-readable medium such as a hard drive or solid state drive. In various different implementations, the storage device 806 can be a floppy disk device, a hard disk device, an optical disk device, or a tape device, a flash memory or other similar solid state memory device, or an array of devices, including devices in a storage area network or other configurations. The computer program product contains instructions that, when executed, perform one or more methods, such as those described above.

The high-speed interface 808 manages bandwidth-intensive operations for the computing device 800, while the low speed controller 812 manages lower bandwidth-intensive operations. Such allocation of duties is exemplary only. In one implementation, the high-speed controller 808 is coupled to memory 804, display 816 (e.g., through a graphics processor or accelerator), and to high-speed expansion ports 810, which may accept various expansion cards (not shown). In the implementation, low-speed controller 812 is coupled to storage device 806 and low-speed expansion port 814. The low-speed expansion port, which can include various communication ports (e.g., universal serial bus (USB), Bluetooth, Ethernet, wireless Ethernet) can be coupled to one or more input/output devices, such as a keyboard, a pointing device, a scanner, or a networking device such as a switch or router, e.g., through a network adapter.

The computing device 800 can be implemented in a number of different forms, as shown in the figure. For example, it can be implemented as a server 820, or multiple times in a group of such servers. It may also be implemented as part of a rack server system 824. In addition, it can be implemented in a personal computer such as a laptop computer 822.

Figure 9:
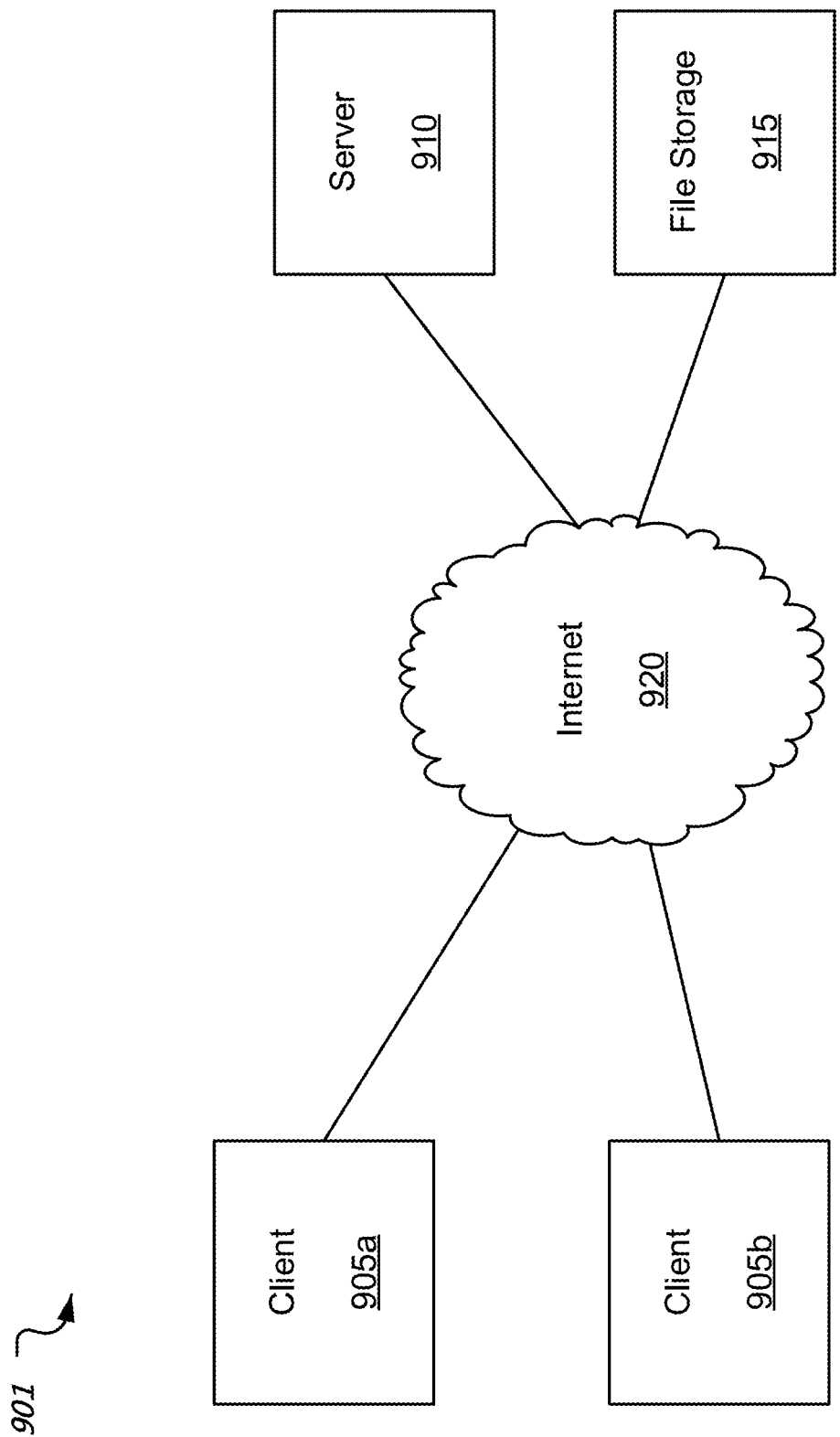
FIG. 9 shows an example of a network architecture.

FIG. 9 shows an example of a network architecture 901 which can be used to implement one or more of the systems and techniques described herein. The network architecture 901 includes clients 905*a*, 905*b*, a network such as the Internet 920, a server 910, and file storage 915. In this example, the file storage 915 resides within a cloud-based storage provider that provides file storage over a public network. In some implementations, the file storage 915 resides on the same private network as the server 910. In some implementations, the server 910 includes the file storage 915. In some implementations, a client 905*a-b* can cause a server 910 to retrieve a CAD document from the file storage 915. The server 910 can execute a CAD program on the retrieved CAD document, make adjustments to different layers associated with the CAD document, provide a user interface to a client device 905*a-b* that renders the different layers. In some implementations, the client 905*a-b* can use a web browser to interact with the CAD program on the server 910.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a non-transitory computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, e.g., after delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any suitable form of programming language, including compiled or interpreted languages, declarative or procedural languages, and it can be deployed in any suitable form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; USB drive, and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., an LCD (liquid crystal display) display device, an OLED (organic light emitting diode) display device, or another monitor, for displaying information to the user, and a keyboard and a pointing device, e.g., a mouse or a trackball, by which the user can provide input to the computer. Other kinds of devices can be used to provide for interaction with a user as well; for example, feedback provided to the user can be any suitable form of sensory feedback, e.g., visual feedback, auditory feedback, or tactile feedback; and input from the user can be received in any suitable form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a browser user interface through which a user can interact with an implementation of the subject matter described is this specification, or any combination of one or more such back-end, middleware, or front-end components. The components of the system can be interconnected by any suitable form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many implementation details, these should not be construed as limitations on the scope of what is being or may be claimed, but rather as descriptions of features specific to particular embodiments of the disclosed subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the inventions have been described. Other embodiments are within the scope of the following claims. In addition, actions recited in the claims can be performed in a different order and still achieve desirable results.

What is claimed is:

1. A method implemented by a computer, comprising:
   maintaining, by a processor in a memory and for concurrent presentation on a device, a first map layer of a CAD document with a first geographic coordinate system and a second map layer of the CAD document with a second different coordinate system;
   creating, by the processor, a coordinate reference system that has an origin at an initial origin location and flat surface projection that converts geographical coordinates from the first geographic coordinate system of the first map layer of the CAD document onto a flat surface;
   inverting, by the processor, a vertical axis in the coordinate reference system;
   aligning based on the inverting, by the processor, one or more increasing values relative to a direction;
   determining, by the processor, a new origin location for the origin, wherein determining the new origin location comprises:
   i) unprojecting, using the flat surface projection that converts geographical coordinates from the first geographic coordinate system with which the first map layer of the CAD document is maintained, the first geographic coordinate system onto the coordinate reference system, and
   ii) using, as the new origin location, a location on the coordinate reference system onto which a feature for the first geographic coordinate system, with which the first map layer of the CAD document is maintained, is unprojected;
   updating, by the processor, the coordinate reference system to have the origin at the new origin location;
   projecting, by the processor, the second different coordinate system, with which the second map layer of the CAD document is maintained, onto the coordinate reference system using the new origin location;
   determining, by the processor, a projection from the first geographic coordinate system to the second different coordinate system to produce a determined projection, wherein determining the projection comprises using the unprojection of the first geographic coordinate system, with which the first map layer of the CAD document is maintained, onto the coordinate reference system and the projection of the second different coordinate system, with which the second map layer of the CAD document is maintained, onto the coordinate reference system;
   generating, by the processor using the determined projection, instructions for presentation of a user interface that depicts the first map layer of the CAD document concurrently with the second map layer of the CAD document; and
   providing, by the processor to the device, the instructions to cause the device to present the user interface.

2. The method of claim 1, comprising:
   receiving, from the device, input data that (i) indicates user interaction with the user interface and (ii) identifies a first point in the first geographic coordinate system;
   converting, using the input data and the determined projection, the first point to a second point in the second different coordinate system; and
   determining an action to perform for the second map layer using the second point in the second different coordinate system.

3. The method of claim 2, wherein determining the action to perform for the second map layer comprises determining that the input data indicates a request for a zoom operation at the first point, the method further comprising:
   determining an updated zoom level using the zoom operation and a zoom level for the second map layer presented in the user interface;

retrieving, from the memory, content for the second map layer using the second point and the updated zoom level; and providing, to the device, the content for the second map layer to cause the device to present the content in the user interface.

4. The method of claim 3, wherein retrieving the content comprises retrieving an image tile for the second map layer that depicts data for the second point at the updated zoom level, and wherein providing the content comprises providing, to the device, the image tile for the second map layer to cause the device to present the image tile in the user interface.

5. The method of claim 4, wherein retrieving the image tile comprises retrieving an image tile that has a first coordinate that represents the updated zoom level and one or more second coordinates that encompass the second point.

6. The method of claim 1, wherein using, as the new origin location, the location on the coordinate reference system onto which the feature for the first geographic coordinate system is unprojected comprises using, as the new origin location, the location on the coordinate reference system onto which a top, left corner of the first map layer for the first geographic coordinate system is unprojected.

7. The method of claim 1, wherein:
creating the coordinate reference system that has the origin at the initial origin location comprises creating the coordinate reference system that has the origin at the initial origin location with a first coordinate for a first axis and a second coordinate for a second axis; and
updating the coordinate reference system to have the origin at the new origin location comprises updating the coordinate reference system to have the origin at the new origin location with a third coordinate for the first axis and a fourth coordinate for the second axis, the third coordinate being a different coordinate than the first coordinate and the fourth coordinate being a different coordinate than the second coordinate.

8. The method of claim 1, wherein the first map layer comprises an interactive layer, and wherein the first geographic coordinate system comprises latitude and longitude coordinates.

9. The method of claim 1, wherein the second map layer comprises an image layer that depicts content of a floorplan, wherein the image layer comprises one or more image tiles, and wherein the second different coordinate system comprises a Cartesian coordinate system.

10. The method of claim 1, wherein determining the projection from the first geographic coordinate system to the second different coordinate system comprises determining a first projection for a first floorplan from the first geographic coordinate system to the second different coordinate system, the method further comprising:
determining a second projection for a second floorplan from a third geographic coordinate system for a third may layer to a fourth different coordinate system for a fourth map layer, the second floorplan being a different floorplan than the first floorplan.

11. A system comprising:
a processor; and
a computer-readable storage medium coupled with the processor, wherein the computer-readable storage medium comprising a program for execution by the processor, the program including instructions which, when executed by the processor, cause the processor to perform operations comprising:

maintaining a first map layer of a CAD document with a first geographic coordinate system and a second map layer of the CAD document with a second different coordinate system;
creating a coordinate reference system that has an origin at an initial origin location and a flat surface projection that converts geographical coordinates from the first geographic coordinate system of the first map layer of the CAD document onto a flat surface;
inverting a vertical axis in the coordinate reference system;
aligning, based on the inverting, one or more increasing values relative to a direction;
determining a new origin location for the origin, wherein determining the new origin location comprises unprojecting, using the flat surface projection that converts geographical coordinates from the first geographic coordinate system with which the first map layer of the CAD document is maintained, the first geographic coordinate system onto the coordinate reference system, and using, as the new origin location, a location on the coordinate reference system onto which a feature for the first geographic coordinate system is, with which the first map layer of the CAD document is maintained, unprojected;
updating the coordinate reference system to have the origin at the new origin location;
projecting the second different coordinate system, with which the second map layer of the CAD document is maintained, onto the coordinate reference system using the new origin location;
determining a projection from the first geographic coordinate system to the second different coordinate system to produce a determined projection, wherein determining the projection comprises using the unprojection of the first geographic coordinate system, with which the first map layer of the CAD document is maintained, onto the coordinate reference system and the projection of the second different coordinate system, with which the second map layer of the CAD document is maintained, onto the coordinate reference system;
generating, using the determined projection, instructions for presentation of a user interface that depicts the first map layer of the CAD document concurrently with the second map layer of the CAD document; and
providing, to a device, the instructions to cause the device to present the user interface.

12. The system of claim 11, wherein the operations further comprise:
receiving, from the device, input data that (i) indicates user interaction with the user interface and (ii) identifies a first point in the first geographic coordinate system;
converting, using the input data and the projection that is determined, the first point to a second point in the second different coordinate system; and
determining an action to perform for the second map layer using the second point in the second different coordinate system.

13. The system of claim 12, wherein determining the action to perform for the second map layer comprises determining that the input data indicates a request for a zoom operation at the first point, wherein the operations comprise:

determining an updated zoom level using the zoom operation and a zoom level for the second map layer presented in the user interface;

retrieving, from memory, content for the second map layer using the second point and the updated zoom level; and providing, to the device, the content for the second map layer to cause the device to present the content in the user interface.

14. The system of claim 13, wherein retrieving the content comprises retrieving an image tile for the second map layer that depicts data for the second point at the updated zoom level, and wherein providing the content comprises providing, to the device, the image tile for the second map layer to cause the device to present the image tile in the user interface.

15. The system of claim 14, wherein retrieving the image tile comprises retrieving an image tile that has a first coordinate that represents the updated zoom level and one or more second coordinates that encompass the second point.

16. The system of claim 11, wherein using, as the new origin location, the location on the coordinate reference system onto which the feature for the first geographic coordinate system is unprojected comprises using, as the new origin location, the location on the coordinate reference system onto which a top, left corner of the first map layer for the first geographic coordinate system is unprojected.

17. The system of claim 11, wherein:
creating the coordinate reference system that has the origin at the initial origin location comprises creating the coordinate reference system that has the origin at the initial origin location with a first coordinate for a first axis and a second coordinate for a second axis; and
updating the coordinate reference system to have the origin at the new origin location comprises updating the coordinate reference system to have the origin at the new origin location with a third coordinate for the first axis and a fourth coordinate for the second axis, the third coordinate being a different coordinate than the first coordinate and the fourth coordinate being a different coordinate than the second coordinate.

18. The system of claim 11, wherein the first map layer comprises an interactive layer, and wherein the first geographic coordinate system comprises latitude and longitude coordinates.

19. The system of claim 11, wherein the second map layer comprises an image layer that depicts content of a floorplan, wherein the image layer comprises one or more image tiles, and wherein the second different coordinate system comprises a Cartesian coordinate system.

20. The system of claim 11, wherein determining the projection from the first geographic coordinate system to the second different coordinate system comprises determining a first projection for a first floorplan from the first geographic coordinate system to the second different coordinate system, and wherein the operations comprise:
determining a second projection for a second floorplan from a third geographic coordinate system for a third may layer to a fourth different coordinate system for a fourth map layer, the second floorplan being a different floorplan than the first floorplan.

21. A non-transitory computer-readable storage medium comprising a program for execution by a processor of a device, the program including instructions which, when executed by the processor, cause the device to perform operations comprising:
maintaining a first map layer of a CAD document with a first geographic coordinate system and a second map layer of the CAD document with a second different coordinate system;
creating a coordinate reference system that has an origin at an initial origin location and flat surface projection that converts geographical coordinates from the first geographic coordinate system of the first map layer of the CAD document onto a flat surface;
inverting a vertical axis in the coordinate reference system;
aligning, based on the inverting, one or more increasing values relative to a direction;
determining a new origin location for the origin, wherein determining the new origin location comprises:
  i) unprojecting, using the flat surface projection that converts geographical coordinates from the first geographic coordinate system with which the first map layer of the CAD document is maintained, the first geographic coordinate system onto the coordinate reference system, and
  ii) using, as the new origin location, a location on the coordinate reference system onto which a feature for the first geographic coordinate system, with which the first map layer of the CAD document is maintained is unprojected;
updating the coordinate reference system to have the origin at the new origin location;
projecting the second different coordinate system onto, with which the second map layer of the CAD document is maintained, the coordinate reference system using the new origin location;
determining a projection from the first geographic coordinate system to the second different coordinate system to produce a determined projection, wherein determining the projection comprises using the unprojection of the first geographic coordinate system, with which the first map layer of the CAD document is maintained, onto the coordinate reference system and the projection of the second different coordinate system, with which the second map layer of the CAD document is maintained, onto the coordinate reference system;
generating, using the determined projection, instructions for presentation of a user interface that depicts the first map layer of the CAD document concurrently with the second map layer of the CAD document; and
providing, to a device, the instructions to cause the device to present the user interface.

* * * * *